United States Patent
Tanaka et al.

(10) Patent No.: US 6,746,908 B2
(45) Date of Patent: Jun. 8, 2004

(54) TEMPERATURE CONTROLLING METHOD, THERMAL TREATING APPARATUS, AND METHOD OF MANUFACTURING SEMICONDUCTOR DEVICE

(75) Inventors: Kazuo Tanaka, Tokyo (JP); Masaaki Ueno, Tokyo (JP); Minoru Nakano, Tokyo (JP); Hideto Yamaguchi, Tokyo (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 67 days.

(21) Appl. No.: 09/964,863

(22) Filed: Sep. 28, 2001

(65) Prior Publication Data

US 2002/0055080 A1 May 9, 2002

(30) Foreign Application Priority Data

Sep. 29, 2000 (JP) ........................................ 2000-298858
Sep. 7, 2001 (JP) ........................................ 2001-272218

(51) Int. Cl.⁷ .......................................... H01L 21/8238
(52) U.S. Cl. ...................... 438/225; 438/297; 438/362; 438/425; 438/439; 438/452

(58) Field of Search .................. 438/464, 618, 438/716; 118/64, 666, 667, 500

(56) References Cited

U.S. PATENT DOCUMENTS 5,603,772 A * 2/1997 Ide .............................. 118/724

* cited by examiner

Primary Examiner—Long Pham
Assistant Examiner—Wai-Sing Louie
(74) Attorney, Agent, or Firm—McGinn & Gibb, PLLC (57) ABSTRACT

A temperature control method is provided which is capable of performing quick, accurate, and error-free soaking control over all wafer areas to be thermally treated at a target temperature without requiring any skilled operator and which can be automated by using a computer. In the temperature control method of controlling a heating apparatus having at least two heating zones in such a manner that temperatures detected at predetermined locations equal a target temperature therefor, temperatures are detected at predetermined locations the number of which is larger than the number of the heating zones, and the heating apparatus is controlled in such a manner that the target temperature falls between a maximum value and a minimum value of a plurality of detected temperatures.

16 Claims, 6 Drawing Sheets

DIAGRAM OF HEATER AS VIEWED FROM ABOVE

TEMPERATURE CONTROLLING METHOD, THERMAL TREATING APPARATUS, AND METHOD OF MANUFACTURING SEMICONDUCTOR DEVICE

BACKGROUND OF THE INVENTION

1. Field of the Invention

The present invention relates to a temperature controlling method, a thermal treating apparatus for a semiconductor manufacturing device or the like, and a method for manufacturing a semiconductor device, and in particular, it relates to a temperature controlling method and a thermal treating apparatus for a semiconductor device or the like, and a method for manufacturing a semiconductor device, wherein in order to thermally treat a treatment target, the thermal treating apparatus is divided into a plurality of heating zones, and target temperatures are set for the plurality of heating zones for temperature control so that the target temperatures are corrected using temperatures detected in areas of the treatment target the number of which is larger than the number of the plurality of heating zones.

2. Description of the Related Art

Figure 6:
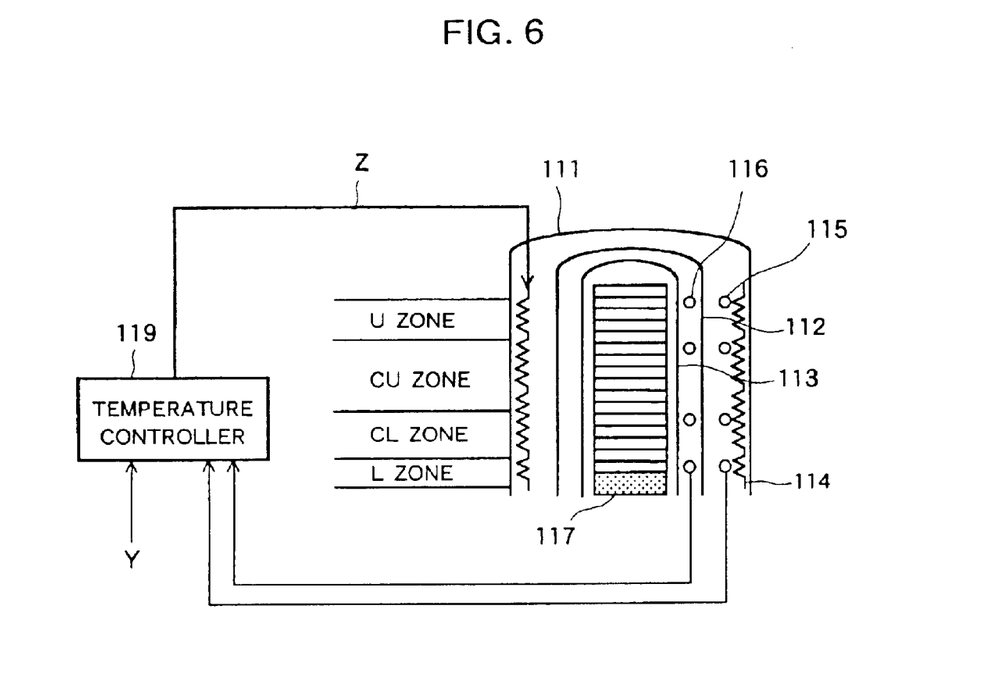
FIG. 6 is a diagram showing a vertical diffusion furnace, which is a typical example of a known thermal treatment apparatus.

With known thermal treating apparatuses, if, a semiconductor wafer (substrate) as a treatment target is thermally treated for film formation or the like, various temperatures are required which correspond to the types of films formed as a result of the treatment and a fabrication process thereof. Accordingly, during the thermal treatment, the temperature of the treatment target is controlled so as to be as close to the treatment temperature as possible (soaking control method). FIG. 6 is a diagram showing the structure of a vertical diffusion furnace, which is typical of such thermal treatment apparatuses. The vertical diffusion furnace shown in FIG. 6 is composed of a soaking pipe 112 and a reaction pipe 113 covered by an outer wall 111, a heater 114 for heating the inside of the reaction pipe 113, heater thermocouples 115 for detecting the temperatures of the heater 114 at a plurality of locations thereof, cascade thermocouples 116 for detecting the temperature at locations between the soaking pipe 112 and the reaction pipe 113, a boat 117 on which a wafer to be subjected to thermal treatment is mounted, and a temperature controller 119 for controlling the amount of operation Z (value of electric power) for the heater 114 on the basis of the temperatures detected by the heater thermocouple 115 and the cascade thermocouple 116 as well as an indicated target temperature Y.

The heater 114 is divided into a plurality of heating zones so as to accurately control the in-furnace temperature (temperature of the reaction pipe 113). If the heater 114 is divided, for example, into four heating zones as shown in FIG. 6, the zones are called U, CU, CL, and L zones (hereinafter these names will be used) respectively from the top to the bottom of the figure. Each of the heating zones has the heater thermocouples 115 and the cascade thermocouples 116 installed therein. In order that the temperatures detected by the cascade thermocouples 116 equal the target temperature, the temperature controller 119 detects the temperatures of the heater thermocouples 115 while calculating the amount of operation Z for the heater 114 in accordance with a given algorithm (PID calculations or the like), thereby adjusting the power value for the heater 114.

In this manner, the conventional temperature control is executed so that the temperatures detected by the cascade thermocouples 116 equal the target value for the wafer treatment. Accordingly, there may be not a small difference between the temperature at the location of the wafer to be actually treated and the corresponding temperature detected by the cascade thermocouple, thereby degrading the quality of the thermal treatment. Thus, it is necessary to control the temperature of an area closer to the wafer or the temperature of the wafer itself so as to equal the target value for the wafer treatment in order to improve the quality of the thermal treatment. To achieve this, a means is required which detects the temperature of an area closer to the wafer or the temperature of the wafer itself. The detection means includes various methods such as the one of inserting thermocouples into the reaction tube to measure the temperatures of the neighborhoods of the wafer, or estimating the wafer temperatures using a mathematical model. Here, by way of example, a description will be given of a method of using temperature measuring wafers (thermocouple-mounted wafers) each comprising a thermocouple directly installed on a wafer.

Figure 7:
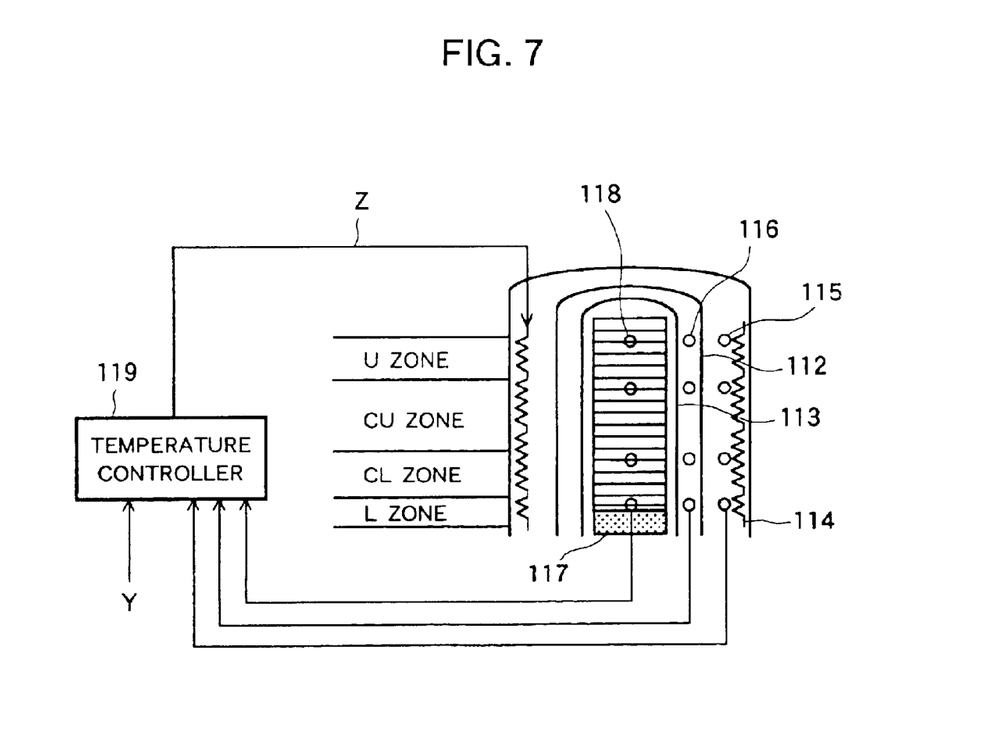
FIG. 7 is a diagram showing that thermocouple-mounted wafers are arranged so as to correspond to heating zones for wafers housed in the vertical diffusion furnace in FIG. 6.

FIG. 7 shows an example using the above described thermocouple-mounted wafers. In this case, thermocouple-mounted wafers 118 are arranged so as to correspond to the U, CU, CL, and L zones, the four heating zones. The heater thermocouples 115 and the cascade thermocouples 116 are also installed at locations corresponding to the U, CU, CL, and L zones. The temperatures detected by the thermocouple-mounted wafers 118 are obtained not only by the heater thermocouples 115 and the cascade thermocouples 116 but also by the temperature controller 119. Further, for the thermocouple-mounted wafers, the location at which the thermocouple is installed and the number of thermocouples installed may depend on the usage thereof. For the thermocouple-mounted wafers 118 in the example described herein, it is assumed that only one thermocouple is installed in the center of the wafer.

Figure 9:
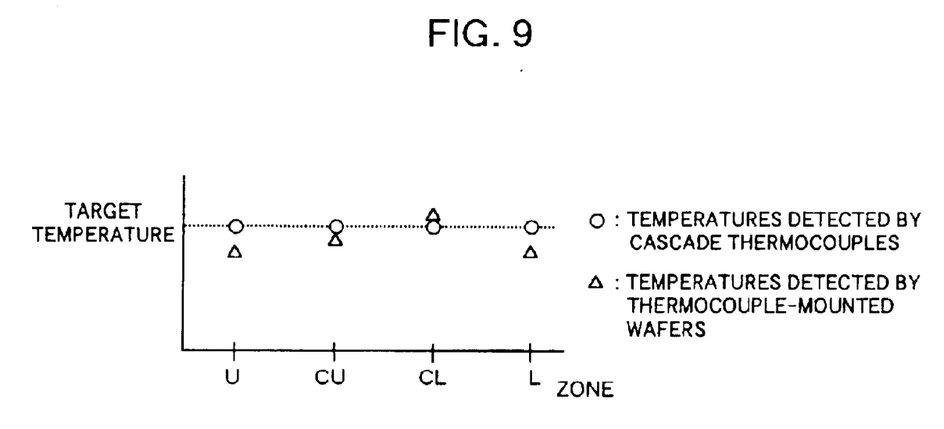
FIG. 9 is a chart showing a relationship between temperatures detected by cascade thermocouples and the thermocouple-mounted wafers in the thermal treatment apparatus set as in FIG. 7, wherein temperature control is carried out so that temperatures detected by the cascade thermocouples equal a target temperature for wafer treatment.

FIG. 9 shows an example of the relationship between the temperatures detected by the cascade thermocouples 116 and the thermocouple-mounted wafers 118, wherein the temperature control is executed so that the temperatures detected by the cascade thermocouples 116 equal the target value for the wafer treatment. In this case, the temperatures (○) detected by the cascade thermocouples 116 equal the target value, whereas there may be errors between the temperatures (Δ) detected by the thermocouple-mounted wafers 118 and the target value. Further, since the magnitude of the error and the like varies among the heating zones, this constitutes a factor reducing the quality of the thermal treatment. In this case, the errors between the temperatures detected by the thermocouple-mounted wafers 118 and the target temperature for the cascade thermocouples 116 may be used as corrective values for this target temperature. For example, in FIG. 9, if the temperature detected by the thermocouple-mounted wafer for the U zone is lower than the target value by 5° C., then this 5° C. can be used as a corrective value for the target temperature for the corresponding cascade thermocouple.

Figure 10:
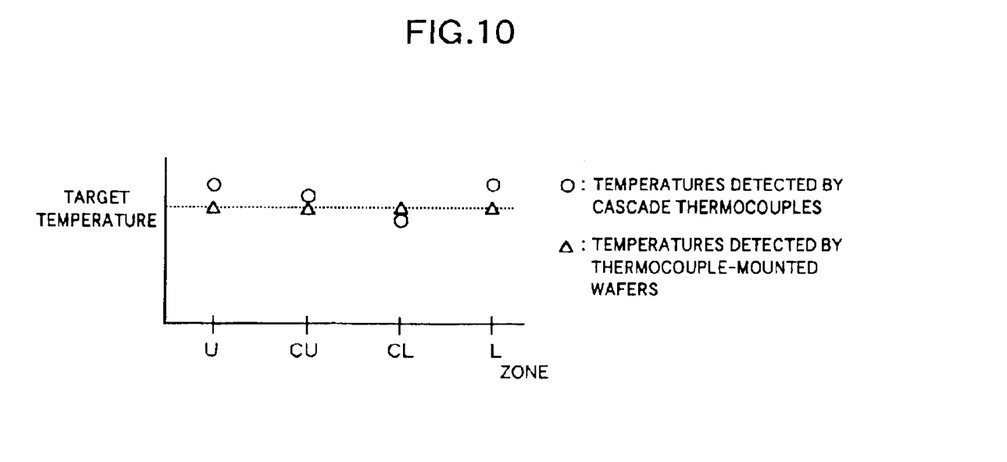
FIG. 10 is a chart showing a relationship between temperatures detected by the cascade thermocouples and the thermocouple-mounted wafers, wherein in order to improve the state shown in FIG. 9, the temperature control is carried out so that the temperatures detected by the cascade thermocouples equal a corrected target temperature.

The above described correction increases the temperature detected by the cascade thermocouple 116 for the U zone, above the original target value by 5° C., but the temperature detected by the thermocouple-mounted wafer for the U zone can be made equal to the original target value. FIG. 10 shows an example of the relationship between the temperatures detected by the cascade thermocouples and the thermocouple-mounted wafers, wherein the correction is executed for all the heating zones. In this case, the temperatures (○) detected by the cascade thermocouples 116 do not equal the original target value, whereas the temperatures (Δ) detected by the thermocouple-mounted wafers 118 equal the target value. The temperature of wafers to be actually thermally treated equals the target value, so that the quality of the thermal treatment can be improved. In this example, however, even if 5° C. is added to the target value for the cascade thermocouple as a corrective value in order to increase the temperature detected by the thermocouple-mounted wafer 118 by 5° C., the temperature detected by the thermocouple-mounted wafer often fails to actually increase by 5° C., thereby requiring an adjustment operation to be repeated several times.

Figure 8:
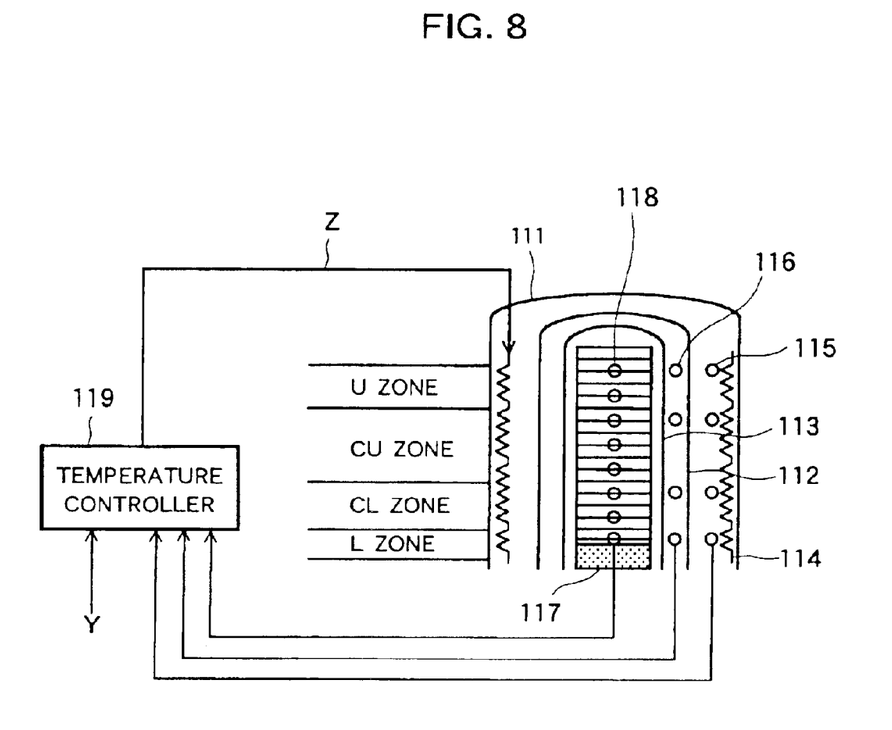
FIG. 8 is a diagram showing that the thermocouple-mounted wafers are arranged so as to correspond to the heating zones for wafers housed in the vertical diffusion furnace in FIG. 6 and to zones between the heating zones.
Figure 11:
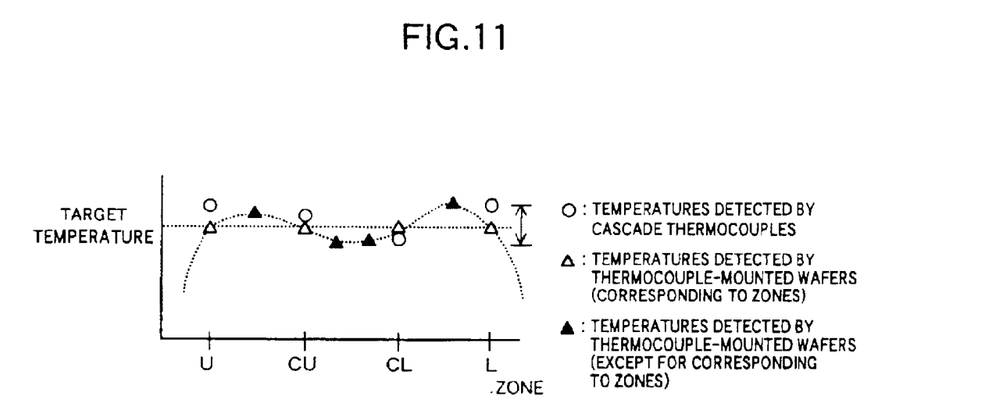
FIG. 11 is a chart showing a relationship between temperatures detected by the cascade thermocouples and the thermocouple-mounted wafers, wherein in the state shown in FIG. 10, additional thermocouple-mounted wafers are arranged at locations other than those corresponding to the heating zones for wafers.

Furthermore, in the construction shown in FIG. 7, the thermocouple-mounted wafers 118 are arranged at the locations corresponding to the heater thermocouples 115 and cascade thermocouples 116 installed for the respective heating zones. In contrast, FIG. 11 shows an example of the relationship between the temperatures detected by the cascade thermocouples and the thermocouple-mounted wafers, wherein in order to measure the temperatures of other wafers, additional plural thermocouple-mounted wafers are arranged as shown in FIG. 8 and temperatures detected thereby are similarly obtained by the temperature controller 119. In this case, the temperatures (Δ) detected by the thermocouple-mounted wafers 118 arranged at locations representative of the corresponding heating zones equal the target value, whereas the temperatures (▲) detected by the thermocouple-mounted wafers arranged at locations different from those mentioned above have errors with respect to the target value. This may lead to differences in the quality of the thermal treatment, thus reducing the rate at which products having a quality of a fixed level are manufactured. To prevent this, the target temperature for the cascade thermocouples 116 may further be corrected so as to minimize the differences in temperature between the wafer areas to thereby obtain a uniform temperature.

For example, if the temperature detected by the thermocouple-mounted wafer installed between the CL zone and the L zone is 3° C. higher than the target value, the target temperature for the cascade thermocouple for the CL and L zones are reduced by about 1° C. as a corrective value. In this case, the corrective value is set at 1° C. instead of 3° C. because if the error of 3° C. is used as a corrective value for the target temperature for the cascade thermocouple as described above, then with respect to the temperatures detected by the thermocouple-mounted wafers corresponding to the heating zones the error is too large compared to the target temperature, thereby preventing the attainment of the object to eliminate the difference in temperature between the wafer areas. Another explanation for the setting of the corrective value at 1° C. is as follows. The temperature detected by the thermocouple-mounted wafer installed between the CL zone and the L zone is affected by corrections for the CL and L zones. Accordingly, if information such as the level of the interference between the heating zones is insufficient, the corrective value must be adjusted a number of times. Thus, the initial value is set at almost 1° C.

Figure 12:
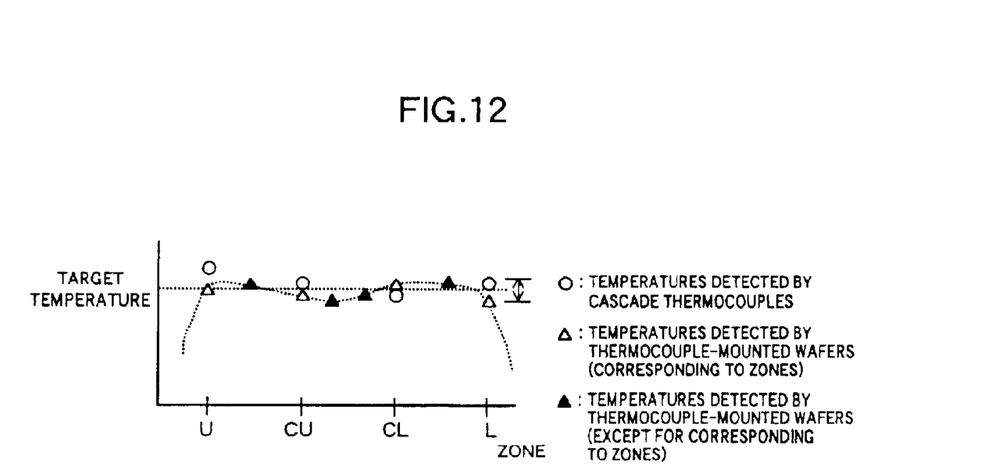
FIG. 12 is a chart showing a relationship between temperatures detected by the cascade thermocouples and the thermocouple-mounted wafers, wherein in order to improve the state shown in FIG. 11, the temperature control is carried out so that the temperatures detected by the cascade thermocouples equal a target value selected by a skilled operator.

FIG. 12 shows an example of the relationship between the temperatures detected by the cascade thermocouples and the thermocouple-mounted wafers, wherein with the construction as shown in FIG. 8, the temperatures detected by all the thermocouple-mounted wafers are adjusted (for example, by a skilled operator) so as to reduce the errors with respect to the target value. In this case, the temperatures (Δ) detected by the thermocouple-mounted wafers corresponding to the heating zones slightly deviates from the target value, but for all the thermocouple-mounted wafers (Δ, ▲), the errors in the detected temperatures with respect to the target value are generally smaller than in FIG. 11 (the width of the variation shown by the arrow is smaller). This serves to increase the number of products having a quality of a fixed level or higher. A skilled operator, however, is required in reducing the errors in the thermocouple-mounted wafers with respect to the target temperature as shown in FIG. 12. Further, it presently takes even skilled operators much time to adjust the errors because the adjustment operation must be repeated many times.

The above described conventional soaking control method for thermal treatment apparatuses comprises dividing the wafer areas of the thermal treatment apparatus into a plurality of heating zones, actually setting target temperatures for all the heating zones, detecting the temperatures of areas subjected to temperature using temperature detecting devices such as the cascade thermocouples in peripheries of the furnace, and providing heating control using the detected temperatures so that treatment targets arranged in the furnace can be treated at the target temperature. Since, however, the determination of a set temperature for the temperature detecting devices depends on the skilled operator's experience or trials, the number of proper able personnel is limited and much time is required for the setting.

SUMMARY OF THE INVENTION

The present invention is intended to obviate the above problems, and has for its object to provide a temperature control method, a thermal treatment apparatus, and a method of manufacturing a semiconductor device, which can simply and promptly adjust (soaking control) the temperatures of all areas of a treatment target to a target value while reducing resulting errors and which can be easily automated using a computer system.

Bearing the above object in mind, according to a first aspect of the present invention, there is provided a temperature control method of controlling a heating apparatus having at least two heating zones so as to adjust temperatures detected at predetermined locations to a target value therefor, the method comprising: detecting temperatures at the predetermined locations the number of which is larger than the number of the heating zones and at least one of which is in each of the heating zones; and controlling the heating apparatus in such a manner that the target temperature falls between a maximum value and a minimum value of a plurality of temperatures detected at a plurality of detected predetermined locations.

With this configuration, even without any skilled operator, the temperatures of all areas of a treatment target can be simply and promptly adjusted (soaking control) to a target value while reducing resulting errors. Thus, the present invention is easily applicable to a vertical CVD apparatus or a sheet-feed apparatus which has a plurality of heating zones and which allows the detection of temperatures at the locations of thermocouple-mounted wafers.

In a preferred form of the first aspect of the present invention, first temperature detectors are disposed at first predetermined locations corresponding to the respective zones, and are used for a temperature control method of controlling the heating apparatus in such a manner that temperatures detected by the first temperature detectors equal a first target temperature. Second temperature detectors are disposed at second predetermined locations which are closer to a treatment target than the first predetermined locations, to obtain an interference matrix M as well as differences $P_0$ between a second target temperature for the second temperature detectors and temperatures detected by the second temperature detectors, the interference matrix M being a matrix of coefficients indicative of the extents of variations of temperatures detected by the second temperature detectors when the first target temperature for the first temperature detectors is varied. The first target temperature is corrected on the basis of the interference matrix M and the errors $P_0$.

With the this configuration, even if there is not any skilled operator, the temperatures of all areas of the treatment target can be simply and promptly adjusted (soaking control) to a target value while reducing resulting errors, and the system can be automated using a computer system. Here, note that in an embodiment of the invention, the first temperature detectors correspond to cascade thermocouples, and the second temperature detectors correspond to thermocouples attached to wafers (thermocouple-mounted wafers). With this construction, temperature control can be carried out while correcting the target temperature for the cascade thermocouples on the basis of the interference matrix M and the errors $P_0$ obtained.

In another preferred form of the first aspect of the present invention, the temperature control method further comprises: determining new errors $P_0'$ by performing temperature control using the corrected first target temperature; and correcting the corrected first target temperature using the new errors $P_0'$ and the interference matrix M.

With this configuration, the temperature control can be accurately carried out to precisely heat the treatment target at a desired temperature.

According to a second aspect of the present invention, there is provided a temperature control method for controlling an apparatus which includes a process chamber, a heating apparatus having at least one heating zone for heating a treatment target provided in the process chamber, and first temperature detectors provided at least one for each zone for detecting heating temperatures provided by the heating apparatus at first predetermined locations, wherein the heating apparatus is controlled on the basis of first detected temperatures detected by the first temperature detectors and a first target temperature for the first detected temperatures, and wherein a plurality of second temperature detectors are disposed at second predetermined locations the number of which is larger than that of the heating zones and which are closer to the treatment target than the first predetermined locations, the second temperature detectors being operable to detect heating temperatures provided by the heating apparatus. The method comprises: comparing second detected temperatures detected by the second temperature detectors with a second target temperature for the second detected temperatures to obtain corrective values for the first target temperature; and correcting the first target temperature by the corrective values to perform temperature control.

In a preferred form of the second aspect of the present invention, the corrective values are obtained before an actual process of actually treating a substrate to be treated.

With the above configurations of the second aspect of the invention, no second temperature detector needs to be provided in the actual process, thereby preventing the adverse effects of the provision of the temperature detectors on the treatment target.

According to a third aspect of the present invention, there is provided a thermal treatment apparatus comprising: a process chamber; a heating apparatus having at least two heating zones and being subjected to temperature control in such a manner that temperatures detected at predetermined locations equal a target temperature therefor; a plurality of temperature detectors for detecting temperatures at predetermined locations the number of which is larger than the number of the heating zones and at least one of which is in each of the heating zones; and a control device for controlling the heating apparatus in such a manner that the target temperature falls between a maximum value and a minimum value of a plurality of temperatures detected by means of the plurality of temperature detectors.

With this configuration, a thermal treatment apparatus can be provided with which even without any skilled operator, the temperatures of all areas of a treatment target can be simply and promptly adjusted (soaking control) to a target value while reducing resulting errors.

According to a fourth aspect of the present invention, there is provided a method of manufacturing a semiconductor device, in which a target substrate is subjected to a heating process by controlling a heating apparatus having at least two heating zones in such a manner that temperatures detected at predetermined locations equal a target temperature therefor, the method comprising: detecting temperatures at predetermined locations the number of which is larger than the number of the heating zones and at least one of which is in each of the heating zones; and controlling the heating apparatus in such a manner that the target temperature falls between a maximum value and a minimum value of a plurality of temperatures detected at a plurality of detected predetermined locations.

With this configuration, a method of manufacturing a semiconductor device can be provided with which even without any skilled operator, the temperatures of all areas of a treatment target can be simply and promptly adjusted (soaking control) to a target value while reducing resulting errors.

DESCRIPTION OF THE PREFERRED EMBODIMENTS

Now, preferred embodiments of the present invention will be described below with reference to the accompanying drawings.

The most fundamental form of the present invention is a temperature control method of controlling a heating apparatus having at least one heating zone so that a temperature detected at a predetermined location equals its target value, wherein the heating apparatus is controlled so that temperature is detected at a plurality of predetermined locations, the number of which is larger than that of the heating zones and that the target temperature falls between a maximum value and a minimum value of a plurality of detected temperatures. In the embodiment described below, a form will be described in which using the above form as a basic construction, temperature control is carried out so that the average of differences between the plurality of detected temperatures and the target temperature is minimized.

Embodiment 1.

Figure 1:
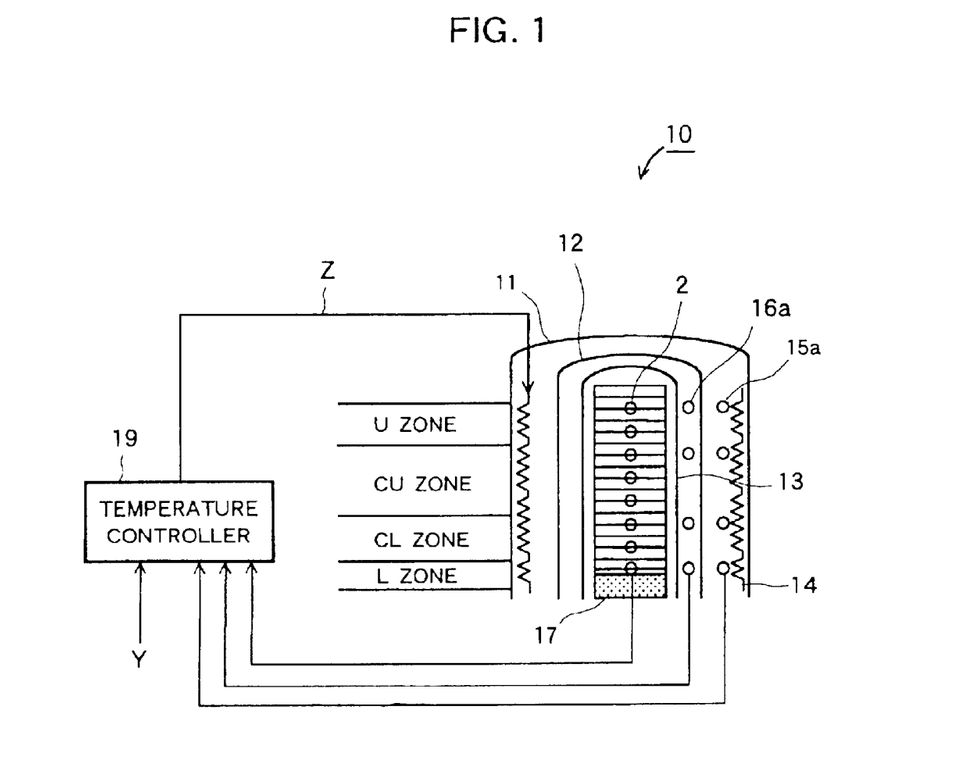
FIG. 1 is a diagram showing an embodiment of a vertical diffusion furnace to which a soaking control method for thermal treatment apparatuses according to the present invention has been applied.
Figure 2:
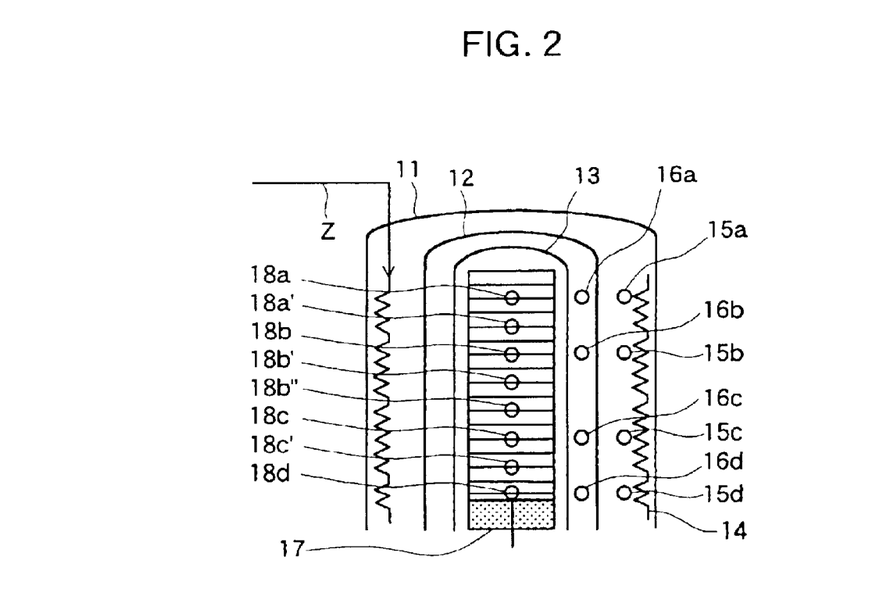
FIG. 2 is an enlarged view showing an interior of an outer wall of the vertical diffusion furnace, shown in FIG. 1.

FIG. 1 is a diagram showing an embodiment of a vertical diffusion furnace to which a soaking control method for thermal treatment apparatuses according to the present invention has been applied. FIG. 2 is an enlarged view showing the interior of an outer wall of the vertical diffusion furnace, shown in FIG. 1. A vertical diffusion furnace 10, shown in FIGS. 1 and 2, is composed of a soaking pipe 12 and a reaction pipe 13 both installed in an outer wall 11, a heater 14 for heating the interior of the furnace, heater thermocouples 15a, 15b, 15c, and 15d for detecting the temperatures of the heater 14 at a plurality of different locations thereof, cascade thermocouples 16a, 16b, 16c, and 16d for detecting the temperatures between the soaking pipe 12 and the reaction pipe 13, a boat 17 having a plurality of wafers and including thermocouple-mounted wafers 18a, 18a', 18b, 18b', 18b", 18c, 18c', and 18d" for detecting wafer temperatures (temperatures of a wafer and the area in which the wafer is arranged), and a temperature controller 19 for detecting an amount of operation Z (value of electric power) for the heater 14 on the basis of the temperatures detected by the heater thermocouples 15a, 15b, 15c, and 15d and the cascade thermocouples 16a, 16b, 16c, and 16d as well as a target temperature Y. In the above construction, the cascade thermocouples 16a, 16b, 16c, and 16d constitute first detectors of the present invention, and the thermocouple-mounted wafers 18a, 18a', 18b, 18b', 18b", 18c, 18c', and 18d" constitute second temperature detectors of the present invention.

In the above described example, the interior of the furnace is divided into four heating zones, that is, U, CU, CL, and L zones from the top to the bottom of the figure in order to accurately control the temperatures of wafer areas in the furnace. In each zone, high frequency power can be applied to between heater terminals. The frequency power can be varied for each zone. The temperature can be adjusted so as to be uniform among all the zones or to increase linearly among them. The heater thermocouples 15a, 15b, 15c, and 15d and the cascade thermocouples 16a, 16b, 16c, and 16d are installed so as to correspond to the U, CU, CL, and L zones. Further, of the eight wafers mounted on the boat 17, four thermocouple-mounted wafers (18a, 18b, 18c, and 18d) are arranged at locations representative of the U, CU, CL, and L zones, two thermocouple-mounted wafers are arranged between the U and CU zones and between the CL and L zones, respectively, and two thermocouple-mounted wafers are arranged between CU and CL zones.

In a method of adjusting the temperatures of the wafer areas in the vertical diffusion furnace 10 so as to be uniform, in preparation for actual manufacturing of products (semiconductor devices), corrective values for a target temperature for temperature control executed during the manufacture are obtained. In order to make the temperatures of the wafer areas uniform, these corrective values for the target temperature are used for the target value for the temperatures detected by the cascade thermocouples. That is, in the temperature control executed during the actual manufacture, ordinary wafers for products are arranged at the locations of the thermocouple-mounted wafers, so that the temperatures of the wafers themselves cannot be detected. Thus, the temperature controller 19 can execute temperature control such that temperatures of the wafer areas are made uniform by applying the corrective values to the target value for the temperatures detected by the always arranged cascade thermocouples 16a, 16b, 16c, and 16d. Of course, if the system is constructed to always measure the temperatures of the wafer areas using a certain method, it should be appreciated that the control performance can be improved by controlling the temperatures of the wafer areas instead of the cascade thermocouples.

Now, the principle of the method of adjusting the temperatures of the wafer areas of the vertical diffusion furnace 10 so as to be uniform will be sequentially described. First, it is necessary to understand the relationship between the temperatures detected by the cascade thermocouples 16a, 16b, 16c, and 16d, used for control, and the temperatures detected by the thermocouple-mounted wafers 18a, 18a', 18b, 18b', 18b", 18c, 18c' and 18d, arranged to detect the temperatures of the wafer areas and which are the targets of the soaking control. In the above described vertical diffusion furnace 10, the temperatures detected by the eight thermocouple-mounted wafers are affected by the heater 14, the temperature of which is detected by the heater thermocouples 15a, 15b, 15c, and 15d corresponding to the U, CU, CL, and L zones, the four heating zones. The level of this effect is numerically determined in a manner described below.

First, the system is controlled so that the temperatures detected by the cascade thermocouples 16a, 16b, 16c, and 16d, corresponding to the U, CU, CL, and L zones, the four heating zones, equal the target value for the wafer treatment. At this time, these temperatures need not be exactly the same as the target value, but since the variation of the temperature normally exhibits different characteristics depending on temperature zones subjected to the control, the level of the effect must be numerically determined using temperature zones that prevent the temperatures from significantly deviating from the target value. After temperature has become stable in all the zones, several ° C. (for example, 10° C.) is added to the target temperature for the cascade thermocouple for one of the zones, for example, the U zone. Subsequently, after a sufficient time to stabilize the temperature has passed, variations in the temperatures detected by the eight thermocouple-mounted wafers are recorded (a positive value is recorded if the temperature has increased, whereas a negative value is recorded if the temperature has decreased). On the basis of these results, the variation added to the target temperature for the cascade thermocouple for the U zone is defined as $\Delta T_U$, and the variations in the temperatures detected by the eight thermocouple-mounted wafers at this time are defined as $\Delta P_{U1}$ to $\Delta P_{U8}$ from the top to the bottom of the furnace. Then, the following equations are obtained:

$$\Delta P_{U1} = \alpha_{U1} \times \Delta T_U$$

$$\Delta P_{U2} = \alpha_{U2} \times \Delta T_U$$

$$\ldots = \ldots$$

$$\ldots = \ldots$$

$$\Delta P_{U8} = \alpha_{U8} \times \Delta T_U$$

where $\alpha_{U1}$ to $\alpha_{U8}$ denote coefficients indicating the level of the effect of a variation in the target value for the cascade thermocouple for the U zone on the temperatures detected by the eight thermocouple-mounted wafers; these coefficients indicate that the larger the numerical values are, the larger the effect is. At the same time, the variation added to the target temperature for the cascade thermocouple for the CU zone is defined as $\Delta T_{CU}$, and the variations in the temperatures detected by the eight thermocouple-mounted wafers 18 at this time are defined as $\Delta P_{CU1}$ to $\Delta P_{CU8}$ from the top to the bottom of the furnace. Then, the variations are expressed as follows:

$$\Delta P_{CU1} = \alpha_{CU1} \times \Delta T_{CU}$$

$$\Delta P_{CU2} = \alpha_{CU2} \times \Delta T_{CU}$$

$$\ldots = \ldots$$

$$\ldots = \ldots$$

$$\Delta P_{CU8} = \alpha_{CU8} \times \Delta T_{CU}$$

For the CL zone, the variations are expressed as follows:

$$\Delta P_{CL1} = \alpha_{CL1} \times \Delta T_{CL}$$

$$\Delta P_{CL2} = \alpha_{CL2} \times \Delta T_{CL}$$

$$\ldots = \ldots$$

$$\ldots = \ldots$$

$$\Delta P_{CL8} = \alpha_{CL8} \times \Delta T_{CL}$$

For the L zone, the variations are expressed as follows:

$$\Delta P_{L1} = \alpha_{L1} \times \Delta T_L$$

$$\Delta P_{L2} = \alpha_{L2} \times \Delta T_L$$

$$\ldots = \ldots$$

$$\ldots = \ldots$$

$$\Delta P_{L8} = \alpha_{L8} \times \Delta T_L$$

On the basis of the above results, when the variations in the temperatures detected by the eight thermocouple-mounted wafers are defined as $\Delta P_1$ to $\Delta P_8$, the following equation is given:

$$\Delta P_1 = (\alpha_{U1} \times \Delta T_U) + (\alpha_{CU1} \times \Delta T_{CU}) +$$

$$(\alpha_{CL1} \times \Delta T_{CL}) + (\alpha_{L1} \times \Delta T_L)$$

$$\Delta P_8 = (\alpha_{U8} \times \Delta T_U) + (\alpha_{CU8} \times \Delta T_{CU}) +$$

$$(\alpha_{CL8} \times \Delta T_{CL}) + (\alpha_{L8} \times \Delta T_L)$$

Thus, the variations in the temperatures detected by the eight thermocouple-mounted wafers can be expressed by the variation in the target temperature for the cascade thermocouple for each zone multiplied by the corresponding coefficient. Accordingly, to bring the temperatures detected by the eight thermocouple-mounted wafers, close to the target value, the above relational expressions must be used to determined corrective values for the target temperature for the cascade thermocouple for each zone. The above rela tional expressions can be expressed as the following Equation (1):

$$\begin{bmatrix} \Delta P_1 \\ \Delta P_2 \\ \Delta P_3 \\ \Delta P_4 \\ \Delta P_5 \\ \Delta P_6 \\ \Delta P_7 \\ \Delta P_8 \end{bmatrix} = \begin{bmatrix} \alpha_{U1} & \alpha_{CU1} & \alpha_{CL1} & \alpha_{L1} \\ \alpha_{U2} & \alpha_{CU2} & \alpha_{CL2} & \alpha_{L2} \\ \alpha_{U3} & \alpha_{CU3} & \alpha_{CL3} & \alpha_{L3} \\ \alpha_{U4} & \alpha_{CU4} & \alpha_{CL4} & \alpha_{L4} \\ \alpha_{U5} & \alpha_{CU5} & \alpha_{CL5} & \alpha_{L5} \\ \alpha_{U6} & \alpha_{CU6} & \alpha_{CL6} & \alpha_{L6} \\ \alpha_{U7} & \alpha_{CU7} & \alpha_{CL7} & \alpha_{L7} \\ \alpha_{U8} & \alpha_{CU8} & \alpha_{CL8} & \alpha_{L8} \end{bmatrix} \times \begin{bmatrix} \Delta T_U \\ \Delta T_{CU} \\ \Delta T_{CL} \\ \Delta T_L \end{bmatrix} \quad (1)$$

In the above Equation (1), the matrix in the first item of the right side is called an "interference matrix" (matrix of the coefficients indicative of the level of the effect of the variation in the target temperature for the cascade thermocouple on the temperatures detected by the thermocouple-mounted wafers) and defined as M, the column vector (variation in the target temperature for the cascade thermocouple) in the second item of the right side is defined as $\Delta C$, and the column vector (variation in the temperature detected by the thermocouple-mounted wafer) in the left side is defined as $\Delta P$. The above equation (1) can be expressed as follows:

$$\Delta P = M \times \Delta C \quad (2)$$

In this manner, the relationship between the temperatures detected by the cascade thermocouples, used for control, and the temperatures detected by the thermocouple-mounted wafers, the targets, can be numerically expressed. These numerical values, however, contain errors due to various factors. Accordingly, it should be appreciated that if accuracy must be improved or a sufficient adjustment time is available, the above described interference matrix may be repeatedly created several times to obtain the average value.

Now, before actual adjustment, the errors between the temperatures detected by the thermocouple-mounted wafers and the target temperature are obtained, which errors occur if the temperatures detected by the cascade thermocouples are controlled so as to equal the target temperature for the wafer treatment. Then, if the temperature detected by the thermocouple-mounted wafer is higher than the target value, the error is expressed as a positive value. If this temperature is lower than the target value, the error is expressed as a negative value. The errors between the temperatures detected by the eight thermocouple-mounted wafers and the target temperature are defined as $E_1$ to $E_8$ from the top to the bottom heating zone, and can be expressed as a matrix vector $P_0$ such as the following Equation (3):

$$P_0 = \begin{bmatrix} E_1 \\ E_2 \\ E_3 \\ E_4 \\ E_5 \\ E_6 \\ E_7 \\ E_8 \end{bmatrix} \quad (3)$$

Next, adjustment is executed to actually bring the temperatures detected by the eight thermocouple-mounted wafers 18a, 18a', 18b, 18b', 18b'', 18c, 18c', and 18d, close to the target value. Before the adjustment, an evaluation criterion must be provided which is used to evaluate how the temperatures detected by the eight thermocouple-mounted wafers, the targets, have been brought close to the target value. Then, in order to increase the number of products having a quality of a fixed level or higher, the errors between the temperature detected by the thermocouple-mounted wafer and the target temperature must be minimized for all the thermocouple-mounted wafers. Thus, an evaluation expression is obtained by squaring and then summing the temperatures detected by the thermocouple-mounted wafers and the target temperature, and the system is controlled so as to minimize the evaluation expression. If adjustment is executed to minimize another evaluation criterion, for example, the sum of the absolute values of the errors, the method described below will be used. The above described evaluation expression is given below.

$$J=|P_0+\Delta P|^2 \tag{4}$$

The right side of this evaluation expression J represents the sum of the errors $P_0$ between the temperatures detected by the eight thermocouple-mounted wafers and the target temperature, which errors are present before the adjustment, and the adjustment-induced variations $\Delta P$ in the temperatures detected by the eight thermocouple-mounted wafers; it represents the errors between the temperatures detected by the eight thermocouple-mounted wafers and the target temperature, which errors are present after the adjustment. The above described Equation (2) is applied to the evaluation expression J (Equation (4)) as follows.

$$J=|P_0+[M\times\Delta C]|^2 \tag{5}$$

Then, matrix transposition is used.

$$J=[P_0+[M\times\Delta C]]^T\times[P_0+[M\times\Delta C]] \tag{6}$$

where "$T$" represents the matrix transposition. Furthermore, the above described Equations (1) and (3) are used to obtain the following Equation (7).

$$J = \left[\begin{bmatrix} E_1 \\ E_2 \\ E_3 \\ E_4 \\ E_5 \\ E_6 \\ E_7 \\ E_8 \end{bmatrix} + \begin{bmatrix} \alpha_{U1} & \alpha_{CU1} & \alpha_{CL1} & \alpha_{L1} \\ \alpha_{U2} & \alpha_{CU2} & \alpha_{CL2} & \alpha_{L2} \\ \alpha_{U3} & \alpha_{CU3} & \alpha_{CL3} & \alpha_{L3} \\ \alpha_{U4} & \alpha_{CU4} & \alpha_{CL4} & \alpha_{L4} \\ \alpha_{U5} & \alpha_{CU5} & \alpha_{CL5} & \alpha_{L5} \\ \alpha_{U6} & \alpha_{CU6} & \alpha_{CL6} & \alpha_{L6} \\ \alpha_{U7} & \alpha_{CU7} & \alpha_{CL7} & \alpha_{L7} \\ \alpha_{U8} & \alpha_{CU8} & \alpha_{CL8} & \alpha_{L8} \end{bmatrix} \times \begin{bmatrix} \Delta T_U \\ \Delta T_{CU} \\ \Delta T_{CL} \\ \Delta T_L \end{bmatrix}\right]^T \times \left[\begin{bmatrix} E_1 \\ E_2 \\ E_3 \\ E_4 \\ E_5 \\ E_6 \\ E_7 \\ E_8 \end{bmatrix} + \begin{bmatrix} \alpha_{U1} & \alpha_{CU1} & \alpha_{CL1} & \alpha_{L1} \\ \alpha_{U2} & \alpha_{CU2} & \alpha_{CL2} & \alpha_{L2} \\ \alpha_{U3} & \alpha_{CU3} & \alpha_{CL3} & \alpha_{L3} \\ \alpha_{U4} & \alpha_{CU4} & \alpha_{CL4} & \alpha_{L4} \\ \alpha_{U5} & \alpha_{CU5} & \alpha_{CL5} & \alpha_{L5} \\ \alpha_{U6} & \alpha_{CU6} & \alpha_{CL6} & \alpha_{L6} \\ \alpha_{U7} & \alpha_{CU7} & \alpha_{CL7} & \alpha_{L7} \\ \alpha_{U8} & \alpha_{CU8} & \alpha_{CL8} & \alpha_{L8} \end{bmatrix} \times \begin{bmatrix} \Delta T_U \\ \Delta T_{CU} \\ \Delta T_{CL} \\ \Delta T_L \end{bmatrix}\right] \tag{7}$$

$$= \begin{bmatrix} E_1 + \alpha_{U1}\times\Delta T_U + \alpha_{CU1}\times\Delta T_{CU} + \alpha_{CL1}\times\Delta T_{CL} + \alpha_{L1}\times\Delta T_L \\ E_2 + \alpha_{U2}\times\Delta T_U + \alpha_{CU2}\times\Delta T_{CU} + \alpha_{CL2}\times\Delta T_{CL} + \alpha_{L2}\times\Delta T_L \\ E_3 + \alpha_{U3}\times\Delta T_U + \alpha_{CU3}\times\Delta T_{CU} + \alpha_{CL3}\times\Delta T_{CL} + \alpha_{L3}\times\Delta T_L \\ E_4 + \alpha_{U4}\times\Delta T_U + \alpha_{CU4}\times\Delta T_{CU} + \alpha_{CL4}\times\Delta T_{CL} + \alpha_{L4}\times\Delta T_L \\ E_5 + \alpha_{U5}\times\Delta T_U + \alpha_{CU5}\times\Delta T_{CU} + \alpha_{CL5}\times\Delta T_{CL} + \alpha_{L5}\times\Delta T_L \\ E_6 + \alpha_{U6}\times\Delta T_U + \alpha_{CU6}\times\Delta T_{CU} + \alpha_{CL6}\times\Delta T_{CL} + \alpha_{L6}\times\Delta T_L \\ E_7 + \alpha_{U7}\times\Delta T_U + \alpha_{CU7}\times\Delta T_{CU} + \alpha_{CL7}\times\Delta T_{CL} + \alpha_{L7}\times\Delta T_L \\ E_8 + \alpha_{U8}\times\Delta T_U + \alpha_{CU8}\times\Delta T_{CU} + \alpha_{CL8}\times\Delta T_{CL} + \alpha_{L8}\times\Delta T_L \end{bmatrix}^T \times \begin{bmatrix} E_1 + \alpha_{U1}\times\Delta T_U + \alpha_{CU1}\times\Delta T_{CU} + \alpha_{CL1}\times\Delta T_{CL} + \alpha_{L1}\times\Delta T_L \\ E_2 + \alpha_{U2}\times\Delta T_U + \alpha_{CU2}\times\Delta T_{CU} + \alpha_{CL2}\times\Delta T_{CL} + \alpha_{L2}\times\Delta T_L \\ E_3 + \alpha_{U3}\times\Delta T_U + \alpha_{CU3}\times\Delta T_{CU} + \alpha_{CL3}\times\Delta T_{CL} + \alpha_{L3}\times\Delta T_L \\ E_4 + \alpha_{U4}\times\Delta T_U + \alpha_{CU4}\times\Delta T_{CU} + \alpha_{CL4}\times\Delta T_{CL} + \alpha_{L4}\times\Delta T_L \\ E_5 + \alpha_{U5}\times\Delta T_U + \alpha_{CU5}\times\Delta T_{CU} + \alpha_{CL5}\times\Delta T_{CL} + \alpha_{L5}\times\Delta T_L \\ E_6 + \alpha_{U6}\times\Delta T_U + \alpha_{CU6}\times\Delta T_{CU} + \alpha_{CL6}\times\Delta T_{CL} + \alpha_{L6}\times\Delta T_L \\ E_7 + \alpha_{U7}\times\Delta T_U + \alpha_{CU7}\times\Delta T_{CU} + \alpha_{CL7}\times\Delta T_{CL} + \alpha_{L7}\times\Delta T_L \\ E_8 + \alpha_{U8}\times\Delta T_U + \alpha_{CU8}\times\Delta T_{CU} + \alpha_{CL8}\times\Delta T_{CL} + \alpha_{L8}\times\Delta T_L \end{bmatrix}$$

$$= \begin{aligned} &(E_1 + \alpha_{U1}\times\Delta T_U + \alpha_{CU1}\times\Delta T_{CU} + \alpha_{CL1}\times\Delta T_{CL} + \alpha_{L1}\times\Delta T_L)^2 + \\ &(E_2 + \alpha_{U2}\times\Delta T_U + \alpha_{CU2}\times\Delta T_{CU} + \alpha_{CL2}\times\Delta T_{CL} + \alpha_{L2}\times\Delta T_L)^2 + \\ &(E_3 + \alpha_{U3}\times\Delta T_U + \alpha_{CU3}\times\Delta T_{CU} + \alpha_{CL3}\times\Delta T_{CL} + \alpha_{L3}\times\Delta T_L)^2 + \\ &(E_4 + \alpha_{U4}\times\Delta T_U + \alpha_{CU4}\times\Delta T_{CU} + \alpha_{CL4}\times\Delta T_{CL} + \alpha_{L4}\times\Delta T_L)^2 + \\ &(E_5 + \alpha_{U5}\times\Delta T_U + \alpha_{CU5}\times\Delta T_{CU} + \alpha_{CL5}\times\Delta T_{CL} + \alpha_{L5}\times\Delta T_L)^2 + \\ &(E_6 + \alpha_{U6}\times\Delta T_U + \alpha_{CU6}\times\Delta T_{CU} + \alpha_{CL6}\times\Delta T_{CL} + \alpha_{L6}\times\Delta T_L)^2 + \\ &(E_7 + \alpha_{U7}\times\Delta T_U + \alpha_{CU7}\times\Delta T_{CU} + \alpha_{CL7}\times\Delta T_{CL} + \alpha_{L7}\times\Delta T_L)^2 + \\ &(E_8 + \alpha_{U8}\times\Delta T_U + \alpha_{CU8}\times\Delta T_{CU} + \alpha_{CL8}\times\Delta T_{CL} + \alpha_{L8}\times\Delta T_L)^2 \end{aligned}$$

Next, to determine the elements $\Delta T_U$, $\Delta T_{CU}$, $\Delta T_{CL}$, and $\Delta T_L$ of $\Delta C$ in order to minimize the evaluation expression J, this expression is partially differentiated for the elements $\Delta T_U$, $\Delta T_{CU}$, $\Delta T_{CL}$, and $\Delta T_L$ of $\Delta C$. First, the partial differentiation of the evaluation expression J for $\Delta TU$ results in the following Equation (8).

$$\frac{\partial J}{\partial \Delta T_U} = \begin{aligned}&((2 \times \alpha_{U1}) \times (E_1 + (\alpha_{U1} \times \Delta T_U) + (\alpha_{CU1} \times \Delta T_{CU}) + (\alpha_{CL1} \times \Delta T_{CL}) + (\alpha_{L1} \times \Delta T_L))) + \\ &((2 \times \alpha_{U2}) \times (E_2 + (\alpha_{U2} \times \Delta T_U) + (\alpha_{CU2} \times \Delta T_{CU}) + (\alpha_{CL2} \times \Delta T_{CL}) + (\alpha_{L2} \times \Delta T_L))) + \\ &((2 \times \alpha_{U3}) \times (E_3 + (\alpha_{U3} \times \Delta T_U) + (\alpha_{CU3} \times \Delta T_{CU}) + (\alpha_{CL3} \times \Delta T_{CL}) + (\alpha_{L3} \times \Delta T_L))) + \\ &((2 \times \alpha_{U4}) \times (E_4 + (\alpha_{U4} \times \Delta T_U) + (\alpha_{CU4} \times \Delta T_{CU}) + (\alpha_{CL4} \times \Delta T_{CL}) + (\alpha_{L4} \times \Delta T_L))) + \\ &((2 \times \alpha_{U5}) \times (E_5 + (\alpha_{U5} \times \Delta T_U) + (\alpha_{CU5} \times \Delta T_{CU}) + (\alpha_{CL5} \times \Delta T_{CL}) + (\alpha_{L5} \times \Delta T_L))) + \\ &((2 \times \alpha_{U6}) \times (E_6 + (\alpha_{U6} \times \Delta T_U) + (\alpha_{CU6} \times \Delta T_{CU}) + (\alpha_{CL6} \times \Delta T_{CL}) + (\alpha_{L6} \times \Delta T_L))) + \\ &((2 \times \alpha_{U7}) \times (E_7 + (\alpha_{U7} \times \Delta T_U) + (\alpha_{CU7} \times \Delta T_{CU}) + (\alpha_{CL7} \times \Delta T_{CL}) + (\alpha_{L7} \times \Delta T_L))) + \\ &((2 \times \alpha_{U8}) \times (E_8 + (\alpha_{U8} \times \Delta T_U) + (\alpha_{CU8} \times \Delta T_{CU}) + (\alpha_{CL8} \times \Delta T_{CL}) + (\alpha_{L8} \times \Delta T_L)))\end{aligned} \quad (8)$$

$$= 2 \times \{(\alpha_{U1}^2 + \alpha_{U2}^2 + \alpha_{U3}^2 + \alpha_{U4}^2 + \alpha_{U5}^2 + \alpha_{U6}^2 + \alpha_{U7}^2 + \alpha_{U8}^2) \times \Delta T_U + \\
((\alpha_{U1} \times \alpha_{CU1}) + (\alpha_{U2} \times \alpha_{CU2}) + (\alpha_{U3} \times \alpha_{CU3}) + (\alpha_{U4} \times \alpha_{CU4}) + \\
(\alpha_{U5} \times \alpha_{CU5}) + (\alpha_{U6} \times \alpha_{CU6}) + (\alpha_{U7} \times \alpha_{CU7}) + (\alpha_{U8} \times \alpha_{CU8})) \times \Delta T_{CU} + \\
(\alpha_{U5} \times \alpha_{CL5}) + (\alpha_{U6} \times \alpha_{CL6}) + (\alpha_{U7} \times \alpha_{CL7}) + (\alpha_{U8} \times \alpha_{CL8})) \times \Delta T_{CL} + \\
((\alpha_{U1} \times \alpha_{L1}) + (\alpha_{U2} \times \alpha_{L2}) + (\alpha_{U3} \times \alpha_{L3}) + (\alpha_{U4} \times \alpha_{L4}) + \\
(\alpha_{U5} \times \alpha_{L5}) + (\alpha_{U6} \times \alpha_{L6}) + (\alpha_{U7} \times \alpha_{L7}) + (\alpha_{U8} \times \alpha_{L8})) \times \Delta T_L + \\
((\alpha_{U1} \times E_1) + (\alpha_{U2} \times E_2) + (\alpha_{U3} \times E_3) + (\alpha_{U4} \times E_4) + \\
(\alpha_{U5} \times E_5) + (\alpha_{U6} \times E_6) + (\alpha_{U7} \times E_7) + (\alpha_{U8} \times E_8))\}$$

The evaluation expression J is then partially differentiated for the elements $\Delta_{CU}$, $\Delta T_{CL}$, and $\Delta T_L$ as described above to obtain the following Equations (9), (10), and (11).

$$\frac{\partial J}{\partial \Delta T_{CU}} = \quad (9)$$

$$2 \times \{((\alpha_{U1} \times \alpha_{CU1}) + (\alpha_{U2} \times \alpha_{CU2}) + (\alpha_{U3} \times \alpha_{CU3}) + (\alpha_{U4} \times \alpha_{CU4}) + \\
(\alpha_{U5} \times \alpha_{CU5}) + (\alpha_{U6} \times \alpha_{CU6}) + \\
(\alpha_{U7} \times \alpha_{CU7}) + (\alpha_{U8} \times \alpha_{CU8})) \times \Delta T_U + \\
(\alpha_{CU1}^2 + \alpha_{CU2}^2 + \alpha_{CU3}^2 + \alpha_{CU4}^2 + \alpha_{CU5}^2 + \alpha_{CU6}^2 + \alpha_{CU7}^2 + \alpha_{CU8}^2) \times \\
\Delta T_{CU} + ((\alpha_{CU1} \times \alpha_{CL1}) + (\alpha_{CU2} \times \alpha_{CL2}) + (\alpha_{CU3} \times \alpha_{CL3}) + \\
(\alpha_{CU4} \times \alpha_{CL4}) + (\alpha_{CU5} \times \alpha_{CL5}) + (\alpha_{CU6} \times \alpha_{CL6}) + \\
(\alpha_{CU7} \times \alpha_{CL7}) + (\alpha_{CU8} \times \alpha_{CL8})) \times \Delta T_{CL} + \\
((\alpha_{CU1} \times \alpha_{L1}) + (\alpha_{CU2} \times \alpha_{L2}) + (\alpha_{CU3} \times \alpha_{L3}) + \\
(\alpha_{CU4} \times \alpha_{L4}) + (\alpha_{CU5} \times \alpha_{L5}) + (\alpha_{CU6} \times \alpha_{L6}) + \\
(\alpha_{CU7} \times \alpha_{L7}) + (\alpha_{CU8} \times \alpha_{L8})) \times \Delta T_L + \\
((\alpha_{CU1} \times E_1) + (\alpha_{CU2} \times E_2) + (\alpha_{CU3} \times E_3) + (\alpha_{CU4} \times E_4) + \\
(\alpha_{CU5} \times E_5) + (\alpha_{CU6} \times E_6) + (\alpha_{CU7} \times E_7) + (\alpha_{CU8} \times E_8))\}$$

$$\frac{\partial J}{\partial \Delta T_{CL}} = \quad (10)$$

$$2 \times \{((\alpha_{U1} \times \alpha_{CL1}) + (\alpha_{U2} \times \alpha_{CL2}) + (\alpha_{U3} \times \alpha_{CL3}) + (\alpha_{U4} \times \alpha_{CL4}) + \\
(\alpha_{U5} \times \alpha_{CL5}) + (\alpha_{U6} \times \alpha_{CL6}) + \\
(\alpha_{U7} + \alpha_{CL7}) + (\alpha_{U8} \times \alpha_{CL8})) \times \Delta T_U + \\
((\alpha_{CU1} + \alpha_{CL1}) + (\alpha_{CU2} \times \alpha_{CL2}) + (\alpha_{CU3} \times \alpha_{CL3}) + \\
(\alpha_{CU4} \times \alpha_{CL4}) + (\alpha_{CU5} \times \alpha_{CL5}) + (\alpha_{CU6} \times \alpha_{CL6}) + \\
(\alpha_{CU7} \times \alpha_{CL7}) + (\alpha_{CU8} \times \alpha_{CL8})) \times \Delta T_{CU} + \\
(\alpha_{CL1}^2 + \alpha_{CL2}^2 + \alpha_{CL3}^2 + \alpha_{CL4}^2 + \alpha_{CL5}^2 + \alpha_{CL6}^2 + \alpha_{CL7}^2 + \alpha_{CL8}^2) \times \\
\Delta T_{CL} + ((\alpha_{CL1} \times \alpha_{L1}) + (\alpha_{CL2} \times \alpha_{L2}) + (\alpha_{CL3} \times \alpha_{L3}) + \\
(\alpha_{CL4} \times \alpha_{L4}) + (\alpha_{CL5} \times \alpha_{L5}) + (\alpha_{CL6} \times \alpha_{L6}) + \\
(\alpha_{CL7} \times \alpha_{L7}) + (\alpha_{CL8} \times \alpha_{L8})) \times \Delta T_L + \\
((\alpha_{CL1} \times E_1) + (\alpha_{CL2} \times E_2) + (\alpha_{CL3} \times E_3) + (\alpha_{CL4} \times E_4) + \\
(\alpha_{CL5} \times E_5) + (\alpha_{CL6} \times E_6) + (\alpha_{CL7} \times E_7) + (\alpha_{CL8} \times E_8))\}$$

$$\frac{\partial J}{\partial \Delta T_L} = \quad (11)$$

$$2 \times \{((\alpha_{U1} \times \alpha_{L1}) + (\alpha_{U2} \times \alpha_{L2}) + (\alpha_{U3} \times \alpha_{L3}) + (\alpha_{U4} \times \alpha_{L4}) + (\alpha_{U5} \times \\
\alpha_{L5}) + (\alpha_{U6} \times \alpha_{L6}) + (\alpha_{U7} + \alpha_{L7}) + (\alpha_{U8} \times \alpha_{L8})) \times \Delta \\
T_U + ((\alpha_{CU1} + \alpha_{L1}) + (\alpha_{CU2} \times \alpha_{L2}) + (\alpha_{CU3} \times \alpha_{L3}) + \\
(\alpha_{CU4} \times \alpha_{L4}) + (\alpha_{CU5} \times \alpha_{L5}) + (\alpha_{CU6} \times \alpha_{L6}) + \\
(\alpha_{CU7} \times \alpha_{L7}) + (\alpha_{CU8} \times \alpha_{L8})) \times \Delta T_{CU} + \\
((\alpha_{CL1} \times \alpha_{L1}) + (\alpha_{CL2} \times \alpha_{L2}) + (\alpha_{CL3} \times \alpha_{L3}) + \\
(\alpha_{CL4} \times \alpha_{L4}) + (\alpha_{CL5} \times \alpha_{L5}) + (\alpha_{CL6} \times \alpha_{L6}) + \\
(\alpha_{CL7} \times \alpha_{L7}) + (\alpha_{CL8} \times \alpha_{L8})) \times \Delta T_{CL} + \\
(\alpha_{L1}^2 + \alpha_{L2}^2 + \alpha_{L3}^2 + \alpha_{L4}^2 + \alpha_{L5}^2 + \alpha_{L6}^2 + \alpha_{L7}^2 + \alpha_{L8}^2) \times \Delta T_L + \\
((\alpha_{L1} \times E_1) + (\alpha_{L2} \times E_2) + (\alpha_{L3} \times E_3) + (\alpha_{L4} \times E_4) + \\
(\alpha_{L5} \times E_5) + (\alpha_{L6} \times E_6) + (\alpha_{L7} \times E_7) + (\alpha_{L8} \times E_8))\}$$

Thus, on the basis of the results of the partial differentiation of the elements $\Delta T_U$, $\Delta T_{CU}$, $\Delta T_{CL}$, and $\Delta T_L$ of $\Delta T$, the following equations are given.

$$\partial J / \partial \Delta T_U = 0$$
$$\partial J / \partial \Delta T_{CU} = 0$$
$$\partial J / \partial \Delta T_{CL} = 0$$
$$\partial J / \partial \Delta T_L = 0$$

These are four-element linear equation containing the elements $\Delta T_U$, $\Delta T_{CU}$, $\Delta T_{CL}$, and $\Delta T_L$ of $\Delta C$ as variables, and the results $\Delta T_U$, $\Delta T_{CU}$, $\Delta T_{CL}$, and $\Delta T_L$ obtained by solving these simultaneous equations minimize the evaluation expression J. That is, these are corrective values for the target temperature for the cascade thermocouples which values minimize the sum of the square of the differences between the temperature detected by the thermocouple-mounted wafers and the target temperature.

Now, a method of solving the above described simultaneous four-element linear equations will be shown. First, the equation $\partial J/\partial \Delta T_U=0$ can be expressed as the following Equation (12).

$$\begin{bmatrix} \alpha_{U1}^2 + \ldots + \alpha_{U8}^2 \\ (\alpha_{U1} \times \alpha_{CU1}) + \ldots + (\alpha_{U8} \times \alpha_{CU8}) \\ (\alpha_{U1} \times \alpha_{CL1}) + \ldots + (\alpha_{U8} \times \alpha_{CL8}) \\ (\alpha_{U1} \times \alpha_{L1}) + \ldots + (\alpha_{U8} \times \alpha_{L8}) \end{bmatrix}^T \times \begin{bmatrix} \Delta T_U \\ \Delta T_{CU} \\ \Delta T_{CL} \\ \Delta T_L \end{bmatrix} = \quad (12)$$

$$(-1) \times ((\alpha_{U1} \times E_1) + \ldots + (\alpha_{U8} \times E_8))$$

Likewise, the expressions $\partial J/\partial \Delta T_{CU}=0$, $\partial J/\partial \Delta T_{CL}=0$, and $\partial J/\partial \Delta T_L=0$ can be expressed as the following Equations (13), (14), and (15).

$$\begin{bmatrix} (\alpha_{U1} \times \alpha_{CU1}) + \ldots + (\alpha_{U8} \times \alpha_{CU8}) \\ \alpha_{CU1}^2 + \ldots + \alpha_{CU8}^2 \\ (\alpha_{CU1} \times \alpha_{CL1}) + \ldots + (\alpha_{CU8} \times \alpha_{CL8}) \\ (\alpha_{CU1} \times \alpha_{L1}) + \ldots + (\alpha_{CU8} \times \alpha_{L8}) \end{bmatrix}^T \times \begin{bmatrix} \Delta T_U \\ \Delta T_{CU} \\ \Delta T_{CL} \\ \Delta T_L \end{bmatrix} = \quad (13)$$

$$(-1) \times ((\alpha_{CU1} \times E_1) + \ldots + (\alpha_{CU8} \times E_8))$$

$$\begin{bmatrix} (\alpha_{U1} \times \alpha_{CL1}) + \ldots + (\alpha_{U8} \times \alpha_{CL8}) \\ (\alpha_{CU1} \times \alpha_{CL1}) + \ldots + (\alpha_{CU8} \times \alpha_{CL8}) \\ \alpha_{CL1}^2 + \ldots + \alpha_{CL8}^2 \\ (\alpha_{CL1} \times \alpha_{L1}) + \ldots + (\alpha_{CL8} \times \alpha_{L8}) \end{bmatrix}^T \times \begin{bmatrix} \Delta T_U \\ \Delta T_{CU} \\ \Delta T_{CL} \\ \Delta T_L \end{bmatrix} = \quad (14)$$

$$(-1) \times ((\alpha_{CL1} \times E_1) + \ldots + (\alpha_{CL8} \times E_8))$$

$$\begin{bmatrix} (\alpha_{U1} \times \alpha_{L1}) + \ldots + (\alpha_{U8} \times \alpha_{L8}) \\ (\alpha_{CU1} \times \alpha_{L1}) + \ldots + (\alpha_{CU8} \times \alpha_{L8}) \\ (\alpha_{CL1} \times \alpha_{L1}) + \ldots + (\alpha_{CL8} \times \alpha_{L8}) \\ \alpha_{L1}^2 + \ldots + \alpha_{L8}^2 \end{bmatrix}^T \times \begin{bmatrix} \Delta T_U \\ \Delta T_{CU} \\ \Delta T_{CL} \\ \Delta T_L \end{bmatrix} = \quad (15)$$

$$(-1) \times ((\alpha_{L1} \times E_1) + \ldots + (\alpha_{L8} \times E_8))$$

The above four equations can be expressed as the following Equation (16) using matrices.

$$\begin{bmatrix} \alpha_{U1}^2 + \ldots + \alpha_{U8}^2 & (\alpha_{U1} \times \alpha_{CU1}) + \ldots + (\alpha_{U8} \times \alpha_{CU8}) & (\alpha_{U1} \times \alpha_{CL1}) + \ldots + (\alpha_{U8} \times \alpha_{CL8}) & (\alpha_{U1} \times \alpha_{L1}) + \ldots + (\alpha_{U8} \times \alpha_{L8}) \\ (\alpha_{U1} \times \alpha_{CU1}) + \ldots + (\alpha_{U8} \times \alpha_{CU8}) & \alpha_{CU1}^2 + \ldots + \alpha_{CU8}^2 & (\alpha_{CU1} \times \alpha_{CL1}) + \ldots + (\alpha_{CU8} \times \alpha_{CL8}) & (\alpha_{CU1} \times \alpha_{L1}) + \ldots + (\alpha_{CU8} \times \alpha_{L8}) \\ (\alpha_{U1} \times \alpha_{CL1}) + \ldots + (\alpha_{U8} \times \alpha_{CL8}) & (\alpha_{CU1} \times \alpha_{CL1}) + \ldots + (\alpha_{CU8} \times \alpha_{CL8}) & \alpha_{CL1}^2 + \ldots + \alpha_{CL8}^2 & (\alpha_{CL1} \times \alpha_{L1}) + \ldots + (\alpha_{CL8} \times \alpha_{L8}) \\ (\alpha_{U1} \times \alpha_{L1}) + \ldots + (\alpha_{U8} \times \alpha_{L8}) & (\alpha_{CU1} \times \alpha_{L1}) + \ldots + (\alpha_{CU8} \times \alpha_{L8}) & (\alpha_{CL1} \times \alpha_{L1}) + \ldots + (\alpha_{CL8} \times \alpha_{L8}) & \alpha_{L1}^2 + \ldots \alpha_{L8}^2 \end{bmatrix} \times \quad (16)$$

$$\begin{bmatrix} \Delta T \\ \Delta T_{CU} \\ \Delta T_{CL} \\ \Delta T_L \end{bmatrix} = \begin{bmatrix} (-1) \times ((\alpha_{U1} \times E_1) + \ldots + (\alpha_{U8} \times E_8)) \\ (-1) \times ((\alpha_{CU1} \times E_1) + \ldots + (\alpha_{CU8} \times E_8)) \\ (-1) \times ((\alpha_{CL1} \times E_1) + \ldots + (\alpha_{CL8} \times E_8)) \\ (-1) \times ((\alpha_{L1} \times E_1) + \ldots + (\alpha_{L8} \times E_8)) \end{bmatrix}$$

In the above Equation (16), the matrix in the first item of the left side can be expressed as the following Equation (17) using the interference matrix M in Equation (2).

$$\begin{bmatrix} \alpha_{U1}^2 + \ldots + \alpha_{U8}^2 & (\alpha_{U1} \times \alpha_{CU1}) + \ldots + (\alpha_{U8} \times \alpha_{CU8}) & (\alpha_{U1} \times \alpha_{CL1}) + \ldots + (\alpha_{U8} \times \alpha_{CL8}) & (\alpha_{U1} \times \alpha_{L1}) + \ldots + (\alpha_{U8} \times \alpha_{L8}) \\ (\alpha_{U1} \times \alpha_{CU1}) + \ldots + (\alpha_{U8} \times \alpha_{CU8}) & \alpha_{CU1}^2 + \ldots + \alpha_{CU8}^2 & (\alpha_{CU1} \times \alpha_{CL1}) + \ldots + (\alpha_{CU8} \times \alpha_{CL8}) & (\alpha_{CU1} \times \alpha_{L1}) + \ldots + (\alpha_{CU8} \times \alpha_{L8}) \\ (\alpha_{U1} \times \alpha_{CL1}) + \ldots + (\alpha_{U8} \times \alpha_{CL8}) & (\alpha_{CU1} \times \alpha_{CL1}) + \ldots + (\alpha_{CU8} \times \alpha_{CL8}) & \alpha_{CL1}^2 + \ldots + \alpha_{CL8}^2 & (\alpha_{CL1} \times \alpha_{L1}) + \ldots + (\alpha_{CL8} \times \alpha_{L8}) \\ (\alpha_{U1} \times \alpha_{L1}) + \ldots + (\alpha_{U8} \times \alpha_{L8}) & (\alpha_{CU1} \times \alpha_{L1}) + \ldots + (\alpha_{CU8} \times \alpha_{L8}) & (\alpha_{CL1} \times \alpha_{L1}) + \ldots + (\alpha_{CL8} \times \alpha_{L8}) & \alpha_{L1}^2 + \ldots + \alpha_{L8}^2 \end{bmatrix} = \quad (17)$$

$$\begin{bmatrix} \alpha_{U1} & \alpha_{CU1} & \alpha_{CL1} & \alpha_{L1} \\ \alpha_{U2} & \alpha_{CU2} & \alpha_{CL2} & \alpha_{L2} \\ \alpha_{U3} & \alpha_{CU3} & \alpha_{CL3} & \alpha_{L3} \\ \alpha_{U4} & \alpha_{CU4} & \alpha_{CL4} & \alpha_{L4} \\ \alpha_{U5} & \alpha_{CU5} & \alpha_{CL5} & \alpha_{L5} \\ \alpha_{U6} & \alpha_{CU6} & \alpha_{CL6} & \alpha_{L6} \\ \alpha_{U7} & \alpha_{CU7} & \alpha_{CL7} & \alpha_{L7} \\ \alpha_{U8} & \alpha_{CU8} & \alpha_{CL8} & \alpha_{L8} \end{bmatrix}^T \times \begin{bmatrix} \alpha_{U1} & \alpha_{CU1} & \alpha_{CL1} & \alpha_{L1} \\ \alpha_{U2} & \alpha_{CU2} & \alpha_{CL2} & \alpha_{L2} \\ \alpha_{U3} & \alpha_{CU3} & \alpha_{CL3} & \alpha_{L3} \\ \alpha_{U4} & \alpha_{CU4} & \alpha_{CL4} & \alpha_{L4} \\ \alpha_{U5} & \alpha_{CU5} & \alpha_{CL5} & \alpha_{L5} \\ \alpha_{U6} & \alpha_{CU6} & \alpha_{CL6} & \alpha_{L6} \\ \alpha_{U7} & \alpha_{CU7} & \alpha_{CL7} & \alpha_{L7} \\ \alpha_{U8} & \alpha_{CU8} & \alpha_{CL8} & \alpha_{L8} \end{bmatrix} = M^T \times M$$

Further, the column vector in the right side can be expressed as the following Equation (18) using the interference matrix M in Equation (2) and the errors $P_0$ before adjustment between the temperatures detected by the eight thermocouple-mounted wafers and the target temperature in Equation (3).

$$\begin{bmatrix} (-1) \times ((\alpha_{U1} \times E_1) + \ldots + (\alpha_{U8} \times E_8)) \\ (-1) \times ((\alpha_{CU1} \times E_1) + \ldots + (\alpha_{CU8} \times E_8)) \\ (-1) \times ((\alpha_{CL1} \times E_1) + \ldots + (\alpha_{CL8} \times E_8)) \\ (-1) \times ((\alpha_{L1} \times E_1) + \ldots + (\alpha_{L8} \times E_8)) \end{bmatrix} = \quad (18)$$

$$(-1) \times \begin{bmatrix} \alpha_{U1} & \alpha_{CU1} & \alpha_{CL1} & \alpha_{L1} \\ \alpha_{U2} & \alpha_{CU2} & \alpha_{CL2} & \alpha_{L2} \\ \alpha_{U3} & \alpha_{CU3} & \alpha_{CL3} & \alpha_{L3} \\ \alpha_{U4} & \alpha_{CU4} & \alpha_{CL4} & \alpha_{L4} \\ \alpha_{U5} & \alpha_{CU5} & \alpha_{CL5} & \alpha_{L5} \\ \alpha_{U6} & \alpha_{CU6} & \alpha_{CL6} & \alpha_{L6} \\ \alpha_{U7} & \alpha_{CU7} & \alpha_{CL7} & \alpha_{L7} \\ \alpha_{U8} & \alpha_{CU8} & \alpha_{CL8} & \alpha_{L8} \end{bmatrix}^T \times \begin{bmatrix} E_1 \\ E_2 \\ E_3 \\ E_4 \\ E_5 \\ E_6 \\ E_7 \\ E_8 \end{bmatrix} = (-1) \times M^T \times P_0$$

Consequently, the simultaneous equations of Equation (16) can be expressed as Equation (19).

$$[M^T \times M] \times \begin{bmatrix} \Delta T_U \\ \Delta T_{CU} \\ \Delta T_{CL} \\ \Delta T_L \end{bmatrix} = (-1) \times M^T \times P_0 \quad (19)$$

Multiplying both sides by an inverse matrix $[M^T \times M]^{-1}$ from the left results in Equation (20).

$$\begin{bmatrix} \Delta T_U \\ \Delta T_{CU} \\ \Delta T_{CL} \\ \Delta T_L \end{bmatrix} = [M^T \times M]^{-1} \times (-1) \times M^T \times P_0 \quad (20)$$

Since the items M and $P_0$ in the right side of Equation (20) are numerical values already obtained as the interference matrix and the errors between the temperatures detected by the eight thermocouple-mounted wafers and the target temperature which errors are present before adjustment, substituting these values for Equation (20) allows the values $\Delta T_U$, $\Delta T_{CU}$, $\Delta T_{CL}$, and $\Delta T_L$ to be determined.

The thus calculated elements $\Delta T_U$, $\Delta T_{CU}$, $\Delta T_{CL}$, and $\Delta T_L$ are corrective values for the target temperature for the cascade thermocouples which values minimize the evaluation expression J, which is used to increase the number of products having a quality of a fixed level or higher. In the above described example, the method has been sequentially described, which solves the simultaneous equations created by the partial differentiation in order to determine the elements $\Delta T_U$, $\Delta T_{CU}$, $\Delta T_{CL}$, and $\Delta T_L$ of $\Delta C$, which minimize the evaluation expression J. In actual operations, however, the simultaneous equations need not be solved, the corrective values for the target temperature for the cascade thermocouples can be determined by obtaining the interference matrix M in Equation (2) and the errors $P_0$ between the temperatures detected by the eight thermocouple-mounted wafers and the target temperature, and substituting the values obtained for the above Equation (20). Finally, the corrective values thus determined are used to execute control, and the results of the adjustment are checked.

With the configuration shown in FIGS. 1 and 2, the corrective values $\Delta T_U$, $\Delta T_{CU}$, $\Delta T_{CL}$, and $\Delta T_L$ calculated above are applied to the target value for the cascade thermocouples for the respective heating zones (U, CU, CL, and L zones). Then, the system is controlled so that these target temperatures equal the temperatures detected by the cascade thermocouples. After a sufficient time to stabilize the temperature has passed, the errors between the temperatures detected by the eight thermocouple-mounted wafers and the original target temperature are checked. If the errors fall within an allowable range, the adjustment is completed. If any error exceeds the allowable range, additional adjustment is executed. The procedure of the additional adjustment is the same as described above. In this case, however, in the first adjustment, the errors between the temperatures detected by the eight thermocouple-mounted wafers and the target temperature which errors are present before adjustment are obtained as $P_0$ (Equation (3)) as described above, whereas in the additional adjustment, the errors between the temperatures detected by the eight thermocouple-mounted wafers and the target temperature which errors are present upon the check of the results of the first adjustment are obtained as $P_0$. Subsequently, as described above, the value obtained is substituted for Equation (20) to determine the elements $\Delta T_U$, $\Delta T_{CU}$, $\Delta T_{CL}$, and $\Delta T_L$, which are further applied to the target temperatures for the cascade thermocouples for the respective heating zones which temperatures have been obtained by the correction during the first adjustment. Then, the system is controlled so that these target temperatures equal the temperatures detected by the cascade thermocouples, and the results of the readjustment are checked. Normally, one or two or at most three adjustment steps enable appropriate results to be obtained. If, however, the allowable range is still exceeded, the procedure is preferably restarted from the obtainment of the interference matrix.

The temperature control method and thermal treatment apparatus described above are used in a semiconductor manufacturing apparatus as a method of manufacturing a semiconductor.

For example, diffusion processes as used when the temperature control method and thermal treatment apparatus are applied to a diffusion apparatus include the following:

<1> Pyrogenic Oxidation.

This process comprises burning a hydrogen gas using an oxygen gas to generate vapors and introducing the vapors into a reaction chamber to oxidize a wafer or a film accumulated thereon.

This treatment uses a temperature between 700 and 1,000° C. and an atmospheric pressure. Considering the oxidation speed, a preferable treatment temperature is between 800 and 1,000° C.

<2> Dry Oxidation

This process comprises introducing an oxygen gas into the reaction chamber to oxidize a wafer or a film accumulated thereon. This treatment uses a temperature between 700 and 1,000° C. and the atmospheric pressure. Considering the oxidation speed, a preferable treatment temperature is between 800 and 1,000° C.

<3> Phosphorous Diffusion

This process comprises introducing phosphorous trioxide ($POCl_3$), an oxygen gas, and a nitrogen gas into the reaction chamber as a carrier gas. This treatment uses a temperature between 800 and 1,000° C. and the atmospheric pressure.

<4> Anneal Process

This process comprises introducing an inactive gas such as a nitrogen gas into the reaction chamber. This treatment uses a temperature between 800 and 1,000° C. and the atmospheric pressure.

For semiconductor devices, the above processes <1> and <2> are widely used to isolate elements from one another, separate electrode or wiring layers from one another, produce a gate oxide film for a MOSFET, a memory cell capacity portion of a DRAM, or a mask for impurity diffusion and ion implantation, or inactivate and protect a surface. Further, the above process <3> is used to dope gate electrodes or wires on a polysilicon film or on a resistor or a contact portion. Moreover, the above process <4> is used to move impurities, intended for an impurity layer, to the interior of a crystal.

Embodiment 2

In Embodiment 1, the corrective values are determined before the actual process, but the corrective values may be determined directly in the actual process. In Embodiment 2, only the interference matrix M is determined before the actual process, and during the treatment of the substrate, that is, during the actual process, the errors $P_0$ between the temperatures detected by the eight thermocouple-mounted wafers and the target temperature are obtained and substituted for Equation (20) to determine the corrective values for the target temperature for the cascade thermocouples. The corrective values determined are applied to the target temperature for temperature control.

Embodiment 3

Figure 3:
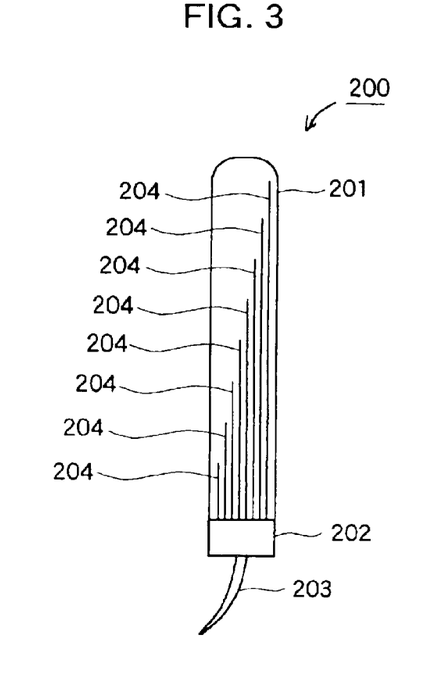
FIG. 3 is a diagram showing an example of a profile thermocouple.

In Embodiment 2, with thermocouple-mounted wafers, the thermocouple is exposed during the treatment of the substrate, so that metal contamination may result. Thus, instead of the thermocouple-mounted wafers, profile thermocouples may be inserted into the furnace. A profile thermocouple 200 comprises thermocouples 204 covered with a ceramic tube 201 made of quartz, SiC, or the like, as shown in FIG. 3, thus reducing metal contamination that may be caused by the thermocouples 204. A plurality of (eight) thermocouples 204 are sealed in the ceramic tube 201 by a thermocouple sealing section 202, and temperature detection signals therefrom are obtained via a wire 203. The thermocouples 204 are provided at locations (height locations) corresponding to the respective thermocouple-mounted wafers shown in Embodiment 1. This profile thermocouple 200 is constituted by a single tube and is suitable for insertion into a reaction chamber with a relatively narrow space. Further, the plurality of profile thermocouples enable temperature to be detected at more locations.

Embodiment 4

Figure 4:
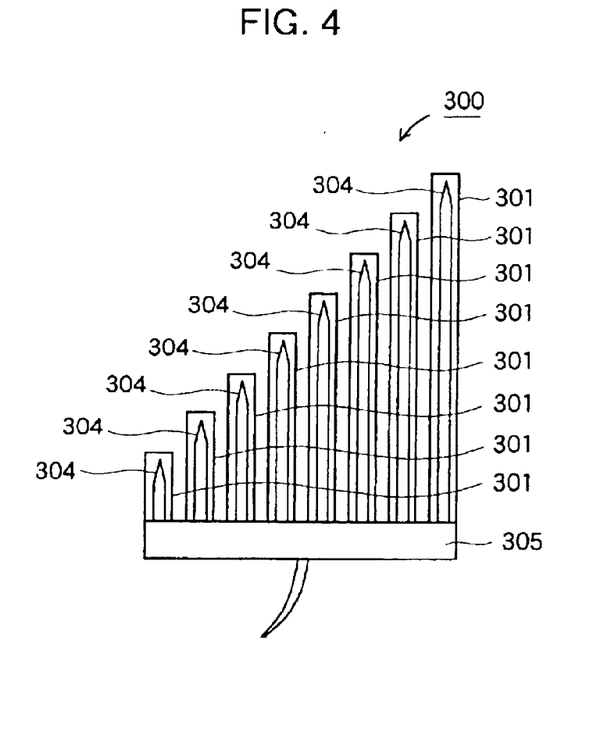
FIG. 4 is a diagram showing an example of a cascade thermocouple.

Furthermore, in detecting the errors between the detected temperatures and the target temperature during the actual process, the temperature control may be executed by providing eight cascade thermocouples 304 as a heater thermocouple (heater-controlling thermocouple) 300 as shown in FIG. 4, obtaining the differences between the temperatures detected by these cascade thermocouples and the target temperature, as the errors $P_0$, substituting the errors $P_0$ for Equation (20) to determine corrective values for the target temperature, and applying the corrective values thus determined to the target temperature. The heater-controlling thermocouple 300 shown in FIG. 4 comprises eight ceramic tubes 301 of quartz or ceramic installed on a thermocouple sealing section 305 in parallel and into each of which the cascade thermocouple 304 is sealed. The heater controlling thermocouple 300 is adapted to be bent and interposed between the soaking tube (12 in FIG. 1) and the reaction tube (13 in FIG. 1). These cascade thermocouples 304 are separately sealed into the ceramic tube 301, thereby preventing the interference between the cascade thermocouples 304. If there is no possibility that such interference may occur, a plurality of thermocouples may be inserted into one ceramic tube.

Embodiment 5

In each of the above described embodiments, the interference matrix M is determined before the actual process. If, however, semiconductor devices or the like are thermally treated which require a long time to process the substrate and which are not affected by a slight variation of the temperature effected when the interference matrix is determined, then during the treatment of the substrate, that is, during the actual process, the interference matrix as well as the errors and corrective values may be determined to correct the target temperature.

Embodiment 6

In the above described embodiments, the vertical apparatus in which the heating zones are vertically formed has been described. The present invention, however, is applicable to a sheet-feed apparatus that processes one to several wafers and in which the heating zones are formed in intra-surface directions (i.e., in parallel with a surface) of the wafer.

Figure 5:
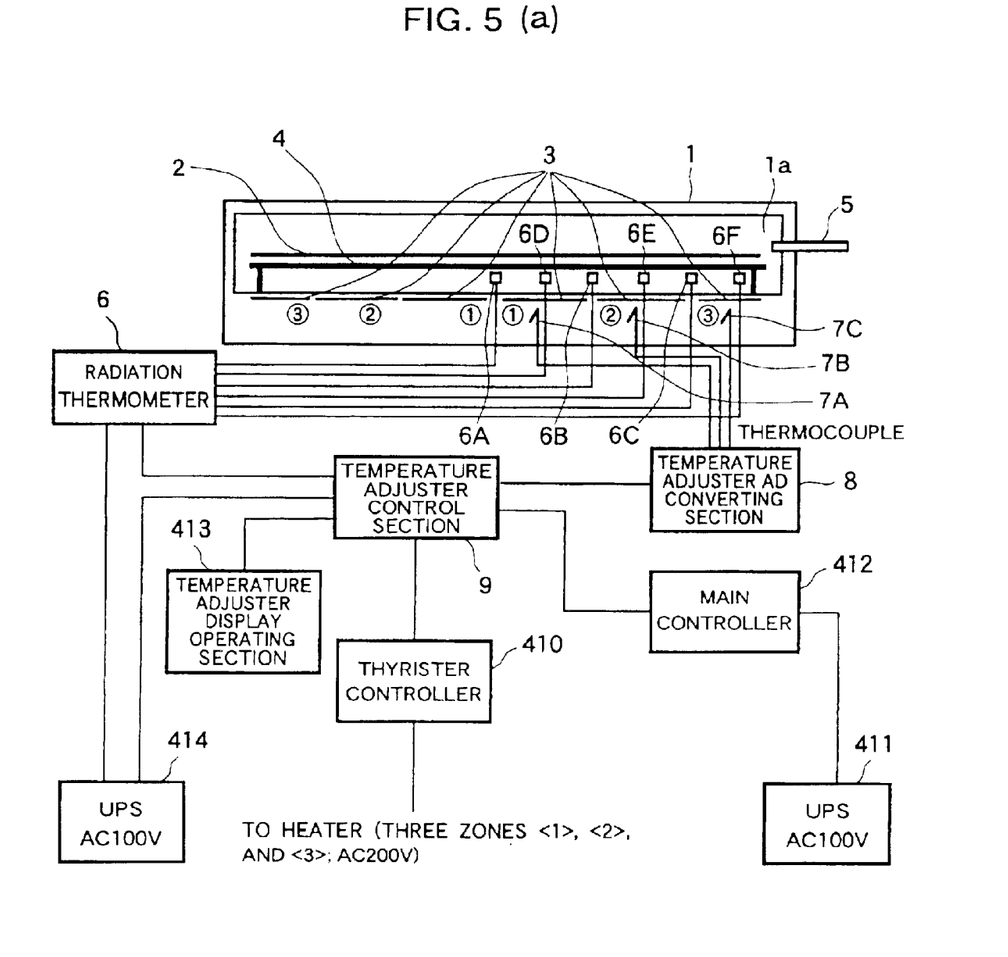
FIG. 5A is a side view showing a sheet-feed apparatus.
FIG. 5B is a top view showing heating zones of the sheet-feed apparatus.

FIGS. 5A and 5B show this sheet-feed apparatus. FIG. 5A is a side view and FIG. 5B is a top view showing a plurality of zones. In this case, if radiation thermometers are used instead of the thermocouple-mounted wafers, non-contact measurements can be carried out, thereby easily preventing metal contamination. The sheet-feed apparatus shown in FIGS. 5A and 5B comprises a heating furnace 1 having a reaction tube 1a constituting a process chamber, and the heating furnace 1 has a susceptor 4 on which a wafer (substrate 2) is placed. The interior of the heating furnace 1 is heated to a predetermined temperature, while a reaction gas is supplied to the furnace, to form a thin film on the substrate 2. A heater 3 acting as a heating source has three zones <1>, <2>, and <3> as heating zones, and heat from each zone is principally absorbed by the susceptor 4, supporting the substrate 2 having a relatively large thermal capacity, and by the substrate 2 and a reaction gas flowing from a gas tube 5.

As control sensors, radiation thermometers (infrared radiation thermometers: second temperature detectors) 6A to 6E are provided so that each heating zone (<1>, <2>, and <3>) are controlled by two of them, and heater thermocouples 7A to 7C are also provided which are used to monitor or control the heater and which correspond to the cascade thermocouples of the vertical apparatus. A temperature adjuster AD converting section 8 subjects thermocouple signals to AD conversions, and transmits the resulting temperature digital data to a temperature adjuster control section 9. The radiation thermometers 6A to 6F also subjects sensor signals to AD conversions, and transmits the resulting temperature digital data to the temperature adjuster control section 9. The temperature adjuster control section 9 uses the received temperature digital data to execute control (PID) calculations to thereby determine heat power values (0 to 100%). Target temperatures used for this PID control are corrected using the already described corrective values. Further, a thyrister controller 410 receives an electric signal (0 to 100%) from the temperature adjuster controller 9 to activate the heater through thyrister ignition. Furthermore, connected with the temperature adjuster control section 9 are a main controller 412 via an alternating power supply 411 and a temperature adjuster display operating section 413. Moreover, the alternating power supply 414 is connected to the radiation thermometers 6A to 6F and the temperature adjuster control section 9.

The radiation thermometers 6A to 6F according to this embodiment are provided inside the reaction tube 1a for accurately measuring and controlling the temperature of the susceptor 4 as a measurement target. The radiation thermometers are used as temperature sensors because they enable non-contact measurements and are quick to respond. Further, when thermocouples are used instead of the radiation thermometers, they must be mounted on the susceptor due to their measurement principle, thus hampering the susceptor 4 from rotating in this case. As described above, the sheet-feed apparatus has zones the number of which is different from that of the vertical apparatus, so that the numbers of corresponding heater thermocouples (first temperature detectors) and radiation thermometers (second temperature detectors) are changed as appropriate.

Even for such a sheet-feed apparatus, the application of the present invention makes the temperature of the wafer more uniform in its intra-surface directions.

Furthermore, even for the vertical apparatus, by providing a plurality of thermocouples on the same surface of the thermocouple-mounted wafer described in connection with the vertical apparatus, the temperature can be made more uniform in the intra-surface directions of the wafer.

The several embodiments of the methods of controlling the temperatures of the areas of the treatment targets have been described. By executing these procedures, the temperatures of the areas of the treatment targets can be promptly and reliably adjusted so to be uniform without any skilled operator. Further, by programming the above procedures using a computer and incorporating them in a temperature controller or the like as software, the temperatures of the areas of the treatment targets can be automatically adjusted so to be uniform without the assistance of a skilled operator. For example, this computerization enables the automation of the setting of the target temperature for the cascade thermocouples, which produces such results as shown in FIG. 9. In the above example, the eight thermocouple-mounted wafers are used, but more such wafers may be used. Alternatively, the temperature of a wider area can be fine-tuned so as to be more uniform by using a thermocouple having a mechanism that passes by vertically arranged wafers from the top to bottom thereof as well as means similar to those described above. Further, in the above examples, the cascade thermocouples are used for control, but if the cascade thermocouples cannot be always installed, the heater thermocouples can be used instead to execute similar adjustment. Furthermore, the radiation thermometers can be used in place of the thermocouple-mounted wafer.

As described above, according to the present invention, corrected target temperatures can be automatically set for a plurality of areas actually subjected to temperature control, using a computer. Therefore, accurate and optimal thermal treatment can be promptly executed even if there is not any skilled operator.

What is claimed is:

1. A temperature control method of controlling a heating apparatus, including at least two heating zones, so as to adjust temperatures detected at predetermined locations to a target temperature, said method, comprising:
   detecting temperatures at said predetermined locations, a number of which is larger than a number of said at least two heating zones and at least one of which is located in each of said at least two heating zones; and
   controlling said heating apparatus in such a manner that said target temperature, detected at said predetermined locations, falls between a maximum value and a minimum value,
      wherein power supplies of said at least two heating zones are independently adjusted.

2. The temperature control method according to claim 1, wherein first temperature detectors are disposed at first predetermined locations corresponding to said at least two heating zones and are used for a temperature control method of controlling said heating apparatus in such a manner that temperatures detected by said first temperature detectors equal a first target temperature,
   wherein second temperature detectors are disposed at second predetermined locations, which are located closer to a treatment target than said first predetermined locations, to obtain an interference matrix, M, as well as differences, $P_0$, between a second target temperature for said second temperature detectors and temperatures detected by said second temperature detectors, said interference matrix, M, including coefficients indicative of variations of temperatures detected by said second temperature detectors, when said first target temperature for said first temperature detector is varied,
   wherein said second temperature detectors detect temperatures at said second predetermined locations, a number of which is larger than a number of said at least two heating zones and at least one of which is located in each of said at least two heating zones, and control said heating apparatus in such a manner that said target temperature detected at said second predetermined locations falls between a maximum value and a minimum value, and
      wherein said first target temperature is corrected on a basis of said interference matrix, M, and said errors, $P_0$.

3. The temperature control method according to claim 2, further comprising:
   determining new errors, $P_0'$, when said first target temperature is corrected; and
   further correcting said first target temperature by using said new errors, $P_0'$, and said interference matrix, M.

4. A temperature control method of controlling an apparatus, which includes a process chamber, a heating apparatus including at least one heating zone for heating a treatment target provided in said process chamber, and first temperature detectors, at least one of said first temperature detectors provided for each of said at least one heating zone for detecting heating temperatures provided by said heating apparatus at first predetermined locations,
   wherein a power supply of said at least one heating zone is independently adjusted,
   wherein said heating apparatus is controlled on a basis of first detected temperatures detected by said first temperature detectors and a first target temperature for said first detected temperatures, and
   wherein a plurality of second temperature detectors are disposed at second predetermined locations, number of which is larger than that of said at least one heating zone and which are closer to said treatment target than said first predetermined locations,
   said method, comprising:
      comparing second detected temperatures detected by said second temperature detectors with a second target temperature to obtain corrective values for said first target temperature; and
      correcting said first target temperature by said corrective values.

5. The temperature control method of claim 4, wherein said corrective values are obtained before an actual process of actually treating said treatment tareet to be treated.

6. A method of manufacturing a semiconductor device, in which a target substrate is subjected to a heating process by controlling a heating apparatus, including at least two heating zones, in such a manner that temperatures detected at predetermined locations equal a target temperature, said method, comprising:
   detecting temperatures at said predetermined locations, a number of which is larger than a number of said at least two heating zones and at least one of which is located in each of said at least two heating zones; and
   controlling said heating apparatus in such a manner that said target temperature, detected at said predetermined location, falls between a maximum value and a minimum value,
      wherein power supplies of said at least two heating zones are independently adjusted.

7. A temperature control method for a furnace, including a plurality of heating zones, comprising:
   controlling a first temperature of each of said plurality of heating zones, detected by a corresponding plurality of first temperature detectors, by a corresponding one of a plurality of heating elements to equal a first target temperature;
   detecting a plurality of second temperatures at each of a plurality of second temperature detectors, a number of said plurality of second temperature detectors being greater than a number of said plurality of first temperature detectors, said plurality of second temperature detectors being located in greater proximity to a target than said plurality of first temperature detectors, and at least one of said plurality of second temperature detectors being located in each of said plurality of heating zones;
   independently and sequentially varying said first temperature of each of said plurality of heating zones to a varied first temperature, which does not equal said first target temperature;
   subsequently detecting a plurality of varied second temperatures by each of said plurality of second temperature detectors;
   determining an interference matrix, M, in a temperature controller that defines a mathematical relationship between a first difference of said first temperature of each of said plurality of heating zones and a second difference of each of said plurality of second temperatures; and
   minimizing errors, $P_0$, between said plurality of second temperatures and said first target temperature of each of said plurality of heating zones.

8. The temperature control method of claim 7, further comprising using said minimizing errors, $P_0$, to adjust each of said plurality of heating elements according to said interference matrix, M, to provide a second target temperature for each of said plurality of heating zones.

9. The temperature control method of claim 8, further comprising:

detecting a plurality of third temperatures at each of a plurality of second temperature detectors; and minimizing new errors, $P_0'$, between said plurality of third temperatures and said second target temperature of each of said plurality of heating zones.

10. The temperature control method according to claim 1, wherein a plurality of first temperature detectors are disposed at and correspond in number to said plurality of first predetermined locations and are used to detect if each of said plurality of first temperature detectors equals said first target temperature.

11. The temperature control method according to claim 1, wherein a plurality of second temperature detectors are disposed at and correspond respectively to said plurality of second predetermined locations, which are located closer to a treatment target than said plurality of first predetermined locations.

12. The temperature control method according to claim 11, wherein said plurality of second temperature detectors are used to obtain an interference matrix, M, as well as errors, $P_0$, between a plurality of second target temperatures for said plurality of second temperature detectors and said plurality of second temperatures detected by said plurality of second temperature detectors.

13. The temperature control method according to claim 12, wherein said interference matrix, M, includes coefficients indicative of variations of said plurality of second temperatures detected by said plurality of second temperature detectors, when said plurality of first target temperatures is varied.

14. The temperature control method according to claim 1, wherein said plurality of first target temperatures is corrected on a basis of said interference matrix, M, and said errors, $P_0$.

15. A temperature control method of controlling a heating apparatus that includes a plurality of heating zones for heating a treatment target located in a process chamber and each of said plurality of heating zones includes one of a plurality of first temperature detectors located at one of a plurality of first predetermined locations, said temperature control method, comprising:

controlling each of a plurality of first temperatures that correspond respectively to each of said plurality of first predetermined locations, such that a plurality of first target temperatures is attained; and comparing each of a plurality of second temperatures detected by a corresponding one of a plurality of second temperature detectors with a second target temperature to obtain corrective values for said plurality of first target temperatures, wherein said plurality of second temperatures are detected at a corresponding plurality of second predetermined locations, a number of which is larger than that of said plurality of heating zones and which are closer to said treatment target than said plurality of first predetermined locations.

16. The temperature control method according to claim 15, further comprising correcting each of said first target temperatures by said corrective values.

* * * * *